United States Patent
Kalevo et al.

(10) Patent No.: US 10,412,414 B2
(45) Date of Patent: Sep. 10, 2019

(54) DECODER AND METHOD FOR DECODING ENCODED INPUT DATA CONTAINING A PLURALITY OF BLOCKS OR PACKETS

(71) Applicant: Gurulogic Microsystems Oy, Turku (FI)

(72) Inventors: Ossi Kalevo, Akaa (FI); Tuomas Kärkkäinen, Turku (FI)

(73) Assignee: GURULOGIC MICROSYSTEMS OY, Turku (FI)

( * ) Notice: Subject to any disclaimer, the term of this patent is extended or adjusted under 35 U.S.C. 154(b) by 270 days.

(21) Appl. No.: 15/357,450

(22) Filed: Nov. 21, 2016

(65) Prior Publication Data

US 2017/0070752 A1 Mar. 9, 2017

Related U.S. Application Data

(63) Continuation-in-part of application No. 13/584,047, filed on Aug. 13, 2012, now Pat. No. 9,538,239.

(30) Foreign Application Priority Data

Aug. 13, 2012 (GB) .................................. 1214400.2

(51) Int. Cl.
*H04N 19/60* (2014.01)
*H04N 19/122* (2014.01)
(Continued)

(52) U.S. Cl.
CPC .............. *H04N 19/60* (2014.11); *H03M 7/30* (2013.01); *H04L 69/22* (2013.01); *H04N 1/41* (2013.01);
(Continued)

(58) Field of Classification Search
CPC .... H04N 19/12; H04N 19/157; H04N 19/188; H04N 19/46; H04N 21/4394;
(Continued)

(56) References Cited

U.S. PATENT DOCUMENTS 5,526,054 A 6/1996 Greenfield et al.
5,832,130 A 11/1998 Kim
(Continued)

FOREIGN PATENT DOCUMENTS

EP 1 370 087 A1 12/2003
EP 1370087 A1 12/2003
(Continued)

OTHER PUBLICATIONS

Communication Pursuant to Article 94(3) EPC issued by the European Patent Office in relation to European Patent Application No. 13 002 520.8-1908 dated Mar. 10, 2017 (9 pages).
(Continued)

*Primary Examiner* — Nathnael Aynalem
(74) *Attorney, Agent, or Firm* — Robert P. Michal, Esq.; Carter, DeLuca & Farrell LLP

(57) ABSTRACT

A decoder includes data processing hardware which is operable to: process encoded input data to extract header information indicative of individual blocks and/or packets, and information indicative of transformations employed to the individual blocks and/or packets; create an initial set of individual blocks and/or packets based on received header data, and prepare a data field in a data storage arrangement for receiving decoded individual block and/or packet content; split or combine individual blocks and/or packets in the data field according to information indicative of splitting/combining; retrieve information describing the transformations and then applying an inverse of the transformations for decoding the encoded and compressed original block and/or packet data to generate corresponding decoded block and/or packet content for populating data field; and when the encoded input data has been at least partially decoded, outputting data from the data field as the decoded output data.

21 Claims, 15 Drawing Sheets

The effect of changing the minimum block size:
The decoding phase

Minimum block size 20x20:
- Blocks A, B, C2-C4, D and E1-E2 have the same color (light) and flat content
- Blocks E4 and F2-F4 have the same color (dark) and flat content
- Blocks E3, and F1 have non-flat content; they are decoded e.g. with inverse DCT
- Block C1 has non-flat content that is decoded e.g. with the inverse slide method Minimum block size 10x10:
- C1 is decoded e.g. with inverse slide method
- Other blocks can be decoded e.g. with inverse DC method

(51) Int. Cl.

| | | |
|---|---|---|
| H04N 19/40 | (2014.01) | |
| H04N 19/48 | (2014.01) | |
| H04L 29/06 | (2006.01) | |
| H04N 19/176 | (2014.01) | |
| H03M 7/30 | (2006.01) | |
| H04N 1/41 | (2006.01) | |
| H04N 7/24 | (2011.01) | |
| H04N 21/439 | (2011.01) | |
| H04N 21/44 | (2011.01) | |
| H04N 21/4402 | (2011.01) | |
| H04N 19/46 | (2014.01) | |
| H04N 19/12 | (2014.01) | |
| H04N 19/157 | (2014.01) | |
| H04N 21/45 | (2011.01) | |
| H04N 19/119 | (2014.01) | |
| H04N 19/14 | (2014.01) | |
| H04N 19/174 | (2014.01) | |
| H04N 19/61 | (2014.01) | |
| H04N 19/169 | (2014.01) | |

(52) U.S. Cl.
CPC ............ H04N 7/24 (2013.01); H04N 19/119 (2014.11); H04N 19/12 (2014.11); H04N 19/14 (2014.11); H04N 19/157 (2014.11); H04N 19/174 (2014.11); H04N 19/176 (2014.11); H04N 19/46 (2014.11); H04N 21/4394 (2013.01); H04N 21/4402 (2013.01); H04N 21/44004 (2013.01); H04N 21/44008 (2013.01); H04N 21/4532 (2013.01); H04N 19/188 (2014.11); H04N 19/61 (2014.11)

(58) Field of Classification Search
CPC ......... H04N 21/44008; H04N 21/4402; H04N 19/186; H04N 19/119; H04N 19/136; H04N 19/154; H04N 19/172; H04N 19/176; H04N 19/192; H04N 19/61; H04N 19/96; H04N 19/14; H04N 19/182; H04N 19/50; H04N 19/91; H04N 19/184; H04N 19/593; H04N 19/60; H04N 19/625; H04N 19/94; H04N 19/98; H04N 19/132; H04N 19/436; H04N 19/44; H04N 19/85; H04N 1/60; H04N 19/105; H04N 19/107; H04N 19/124; H04N 19/147; H04N 19/17; H04N 19/174; H04N 19/19; H04N 19/197; H04N 19/463; H04N 19/503; H04N 19/51; H04N 1/41; H04N 1/64; H04N 21/44004; H04N 21/4532; H04N 7/24
USPC .......................................... 375/240.01–240.29
See application file for complete search history.

(56) References Cited

U.S. PATENT DOCUMENTS

| | | | |
|---|---|---|---|
| 6,614,939 B1 | 9/2003 | Yamauchi | |
| 7,379,496 B2 | 5/2008 | Holcomb et al. | |
| 7,676,101 B2 | 3/2010 | Sato et al. | |
| 8,406,299 B2 | 3/2013 | Karczewicz | |
| 8,576,097 B2 | 11/2013 | Ugur et al. | |
| 2002/0106019 A1 | 8/2002 | Chaddha et al. | |
| 2004/0125204 A1* | 7/2004 | Yamada | H04N 19/197 348/97 |
| 2005/0163214 A1 | 7/2005 | Yachida | |
| 2006/0013235 A1 | 1/2006 | Farnham | |
| 2006/0204115 A1 | 9/2006 | Burazerovic | |
| 2008/0159401 A1 | 7/2008 | Lee et al. | |
| 2008/0304569 A1* | 12/2008 | Lee | H04N 19/139 375/240.16 |
| 2010/0080284 A1* | 4/2010 | Lee | H04N 19/176 375/240.02 |
| 2011/0283168 A1 | 11/2011 | Chen | |
| 2011/0293002 A1 | 12/2011 | Sole et al. | |
| 2012/0008675 A1 | 1/2012 | Karczewicz et al. | |
| 2012/0201300 A1 | 8/2012 | Kim et al. | |

FOREIGN PATENT DOCUMENTS

| | | |
|---|---|---|
| EP | 1 771 007 A2 | 4/2007 |
| EP | 1 814 077 A2 | 8/2007 |
| GB | 2505169 B | 3/2016 |
| JP | 2000333178 A | 11/2000 |
| JP | 2003204550 A | 7/2003 |
| JP | 2006-74728 | 3/2006 |
| JP | 2006-074728 A | 3/2006 |
| JP | 2007-243427 A | 9/2007 |
| JP | 201280212 A | 4/2012 |
| KR | 20020028200 A | 4/2002 |
| KR | 20070048985 A | 5/2007 |
| KR | 10-2011-0028734 | 3/2011 |
| TW | I364990 B | 5/2012 |
| WO | WO 2006/054231 A1 | 5/2006 |
| WO | WO 2010/039822 A2 | 4/2010 |
| WO | WO-2011002504 A1 | 1/2011 |
| WO | WO-2011/031044 A2 | 3/2011 |
| WO | WO-2011031044 A2 | 3/2011 |
| WO | WO-2011053050 A2 | 5/2011 |

OTHER PUBLICATIONS

SIPO Communications of Office Action (Translation from Chinese) issued in Chinese Patent Application No. 201310346690.1 dated Mar. 14, 2016(4 pages).

Japanese Office Action issued by the Japanese Patent Office in relation to Japanese Application No. 2016-141959 dated Nov. 4, 2016 (6 pages). English language translation of Japanese Office Action "Notification of Ground of Rejection" (6 pages).

Notice of Allowance issued by the Ministry of Economic Affair Intellectual Property Office in relation to Taiwanese Application No. 102128926 (2 pages) along with English language translation (1page).

Notice of Allowance issued by the Korean Intellectual Property Office in relation to Korean Application No. 10-2013-0095350 dated May 8, 2017 (5 pages) along with English language translation (1 page).

Second Office Action issued by The State Intellectual Property Office of People's Republic of China in relation to Chinese Application No. 201310346690.1 dated Dec. 28, 2016 (7 pages) with English Translation (8 pages).

Office Action issued by the Japanese Patent Office in relation to Japanese Application No. 2013-165759 dated Oct. 18, 2017 along with English language translation (7 pages).

Summons to Attend Oral Proceedings Pursuant to Rule 115(1) EPC issued by the European Patent Office in relation to European Patent Application No. 13002520.8 dated Oct. 19, 2017 (15 pages).

Examination Report under Sections 12 & 13 of the Patents Act issued by the Intellectual Property Office in India in relation to Indian Application No. 2341/MUM/2013 dated Mar. 23, 2018 (7 pages).

Office Action issued by the Korean Intellectual Property Office in relation to Korean Application No. 10-2013-0095350 dated Dec. 22, 2016 along with English language translation (8 pages).

Office Action issued by the Japanese Patent Office in relation to Japanese Application No. 2013-165759 dated Nov. 26, 2018 (28 pages) along with English language translation of claims (3 pages).

Taiwanese Office Action Issued by the Taiwan Patent Office in relation to Taiwanese Patent Application No. 102128926 dated Jul. 4, 2016 (4 pages).

English Translation of Office Action issued Jul. 4, 2016 in Taiwan Patent Application No. 102128926 dated Jul. 29, 2016 (2 pages).

Decision of Rejection issued by the Japanese Patent Office corresponding to JP Patent Application No. 2013-165759 dated Apr. 5, 2016 (6 pages).

(56) References Cited

OTHER PUBLICATIONS

Certificate of Grant of Patent issued by the Intellectual Property Office in relation to Patent No. GB250169 dated Mar. 16, 2016 (1 page).
Taiwan Office Action, Application No. 102128926 dated Jun. 30, 2015 and English translation (16 pages).
Notification of Ground of Rejection, dated Apr. 1, 2015, issued by the Japanese Patent Office in JP Patent Application No. 2013-165759 and its partial English translation of relevant portions (12 pages).
Office Action, dated Feb. 4, 2015, issued by the Russian Patent Office in a corresponding RU Patent Application No. 2013137371/08 and its partial English translation of relevant portions (5 pages).
Examination Report under Section 18(3), dated Mar. 9, 2015, issued by the United Kingdom Intellectual Property Office in a corresponding UK Patent Application No. 0131214400.2 (3 pages).
Notification of Ground of Rejection, dated Jul. 2, 2014, issued by Japanese Patent Office in a related Japanese Patent Application No. 2013-165759 and its partial English translation of relevant portions (16 pages).
Vaisey et al., "Image Compression with Variable Block Size Segmentation," IEEE Transactions on Signal Processing, vol. 40, No. 8, Aug. 1992 pp. 2040-2060, XP000309977.
Winken et al., "Description of video codding technology proposal by Fraunhofer HHI," Joint Collaborative Team on Video Coding (JCT-VC) of ISO/IEC MPEG & ITU-T VCEG (ISO/IEC JTC1/SC29/WG11 and ITU-T SG16 Q6), Document No. JCTVC-A116, Apr. 15, 2010 pp. 1-44 XP002607630.
Egger et al., "High-performance compression of visual information—a Tutorial Review part I: Still Picture," Proceedings of the IEEE, vol. 87, No. 6, New York, U.S.A., Jun. 1999 pp. 976-1013 XP002148000.
Bross et al., "High Efficiency Video Coding (HEVC) text specification draft 8," Joint Collaborative Team on Video Coding (JCT-VC) of ITU-T SG16 WP3 and ISO/IEC JTC1/SC29/WG11, $10^{th}$ Meeting, Stockholm, SE, Jul. 11-20, 2012, XP030112947 (288 pages).
Digital Accelerator Corp., "Region-based Image Coding System (RICS) with Dynamic Streaming of Code Blocks," JPEG 2000 Committee, Joint Photographic Expert Group Conference, Feb. 15, 1999 (96 pages).
Extended European Search Report, dated Jun. 2, 2014, issued by the European Patent Office in a corresponding European Patent Application No. 13002520.8 (9 pages).
Examination Report under Section 18(3), dated Nov. 18, 2013, issued by the United Kingdom Intellectual Property Office in a corresponding UK Patent Application No. GB1214400.2 (2 pages).
Search Report under Section 17 dated Oct. 25, 2012 issued by the U.K. Patent Office in related U.K. Application No. GB 1214400.2 (5 pages).

\* cited by examiner

The combine bits for combinations inside init blocks —
between blocks that have the same size, init block C: 0011

The combine bits for combinations inside init blocks –
between blocks that have the same size, init block E:
10:

0011:

The combine bits for combinations inside init blocks –
between blocks that have the same size, init block F:
11:

0011:

The combine bits for combinations inside init blocks –
between blocks that do not have the same size, init blocks E and F: 111

Combine bits for combinations between init blocks –
between same- and different-sized blocks: 1101111

Final state after combining and after decoding the color content into the blocks at one go

| Bit | Combine |
|---|---|
| 1 | A + B |
| 1 | A + D |
| 0 | B + C1 |
| 1 | B + C2 |
| 1 | B + E1 |
| 1 | C3 + F11 |
|   | (C3 + F12) |
|   | (D + E33) |
|   | (E2 + F11) |
|   | (E2 + F13) |
| 1 | E4 + F3 |

1 = combine
0 = no combine

**The effect of changing the minimum block size:
- The segmentation phase**

Minimum block size 20x20:

- Split bit string is 0 0 1 0 1 1

901

Minimum block size 10x10:

- Split bit string is 0 0 1 0000 0 1 0010 1 1000

902

**The effect of changing the minimum block size:
The decoding phase**

Minimum block size 20x20:
- Blocks A, B, C2-C4, D and E1-E2 have the same color (light) and flat content
- Blocks E4 and F2-F4 have the same color (dark) and flat content
- Blocks E3, and F1 have non-flat content; they are decoded e.g. with inverse DCT
- Block C1 has non-flat content that is decoded e.g. with the inverse slide method

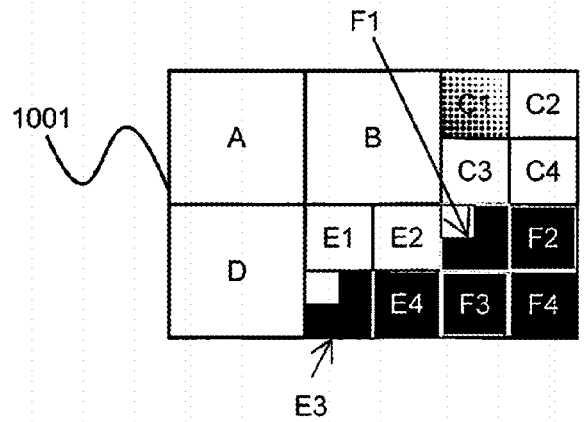

Minimum block size 10x10:
- C1 is decoded e.g. with inverse slide method
- Other blocks can be decoded e.g. with inverse DC method

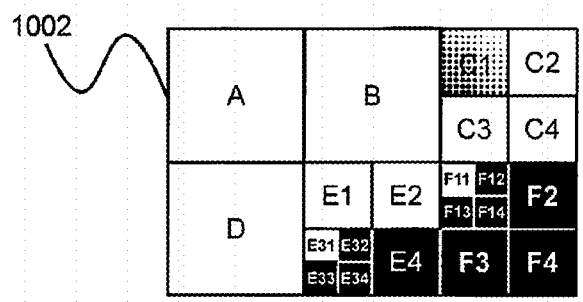

FIG. 10

DECODER AND METHOD FOR DECODING ENCODED INPUT DATA CONTAINING A PLURALITY OF BLOCKS OR PACKETS

CROSS REFERENCE TO RELATED APPLICATIONS

This is a continuation-in-part of U.S. patent application Ser. No. 13/584,047, filed Aug. 13, 2012, which claims the benefit under 35 USC 119(a) and 37 CFR 1.55 to U.K. Application Serial No. GB 1214400.2 filed Aug. 13, 2012, the entire contents of each of which are incorporated herein by reference.

FIELD

The present disclosure relates to decoders for receiving encoded input data and decoding the input data to generate corresponding decoded output data. Moreover, the present disclosure also concerns methods of decoding encoded input data to generate corresponding decoded output data. Furthermore, the present disclosure also concerns software products recorded on non-transitory machine-readable data storage media, wherein the software products are executable upon computing hardware for implementing aforesaid methods.

BACKGROUND INFORMATION

Data content is stored and communicated to an increasing extent by contemporary human population, for example multimedia content via the Internet and wireless communication networks; such multimedia content often includes, for example images, video and audio, but is not limited thereto. The data content stored and communicated between devices, software applications, media systems and data services. During such storage and communication, situations arise where images and video are captured, scanned, transmitted, shared, watched and printed. However, such images and videos are demanding in respect of data memory capacity and communication system bandwidth that is utilized. When communication system bandwidth is limited, such images and videos take significant time to communicate. For addressing such storage requirements, it has been a customary practice to employ image and video encoding methods which also provide a degree of data compression. Some contemporary encoding standards for images and video are provided in Table 1.

TABLE 1

Contemporary Encoding Standards

| JPEG | MPEG-1 | H.261 | WebP | Lucid |
|---|---|---|---|---|
| JPEG2000 | MPEG-2 | H.263 | WebM | GIF |
| JPEG XR | MPEG-4 | H.264 | | PNG |
| | MPEG-4 AVC | H.265 (HEVC) | | TIFF |
| | MPEG-4 MVC | | | BMP |
| | MP3 | | | VC-1 |
| | | | | Theora |
| | | | | AAC |
| | | | | FLAC |
| | | | | Ogg Vorbis |
| | | | | Speex |

Image and audio files are becoming larger as image quality is progressively improved, for example by adoption of high definition (HD) standards and high dynamic range (HDR). However, 3-dimensional (3-D) images, videos and audio are gaining increasing popularity which demands correspondingly more efficient encoding and decoding methods in encoders and decoders, namely "codecs", to cope with associated increased quantities of data to be communicated and stored. However, it is highly desirable that encoding methods that provide a degree of data compression should be substantially lossless in relation to information content when generating the compressed data.

Conventional codecs are described in earlier published patent applications and granted patents, for example as provided in Table 2.

TABLE 2

Earlier Publications Describing Codecs

| Earlier patents or patent applications | Details |
|---|---|
| U.S. Pat. No. 5,832,130 | Samsung Electronics Co. Ltd. |
| U.S. Pat. No. 7,379,496 | Microsoft Corp. |
| GB2274754A1 | Samsung Electronics Co. Ltd. |
| U.S. Pat. No. 6,529,634A1 | Thyagarajan |
| U.S. Pat. No. 7,676,101 | Sony Corp. |
| US2006/0204115A1 | Burazerovic: employs a single type of encoding with variable parameters for encoded blocks |

In general, many known video codecs are not able to code efficiently extensive areas of images with substantially constant parameters whilst concurrently being able to encode highly spatially detailed areas of the images. It is customary practice to employ motion compensation in a form of prediction and prediction error coding methods based upon use of transformations, for example discrete cosine transform (DCT) and wavelet transformations. These transformations employ a process wherein portions of a given image, for example a still image or an image forming a part of a video sequence, are divided into blocks which are then subject to encoding processes. The blocks are, for example, 8×8 image elements, 4×4 image elements or similar. Such relatively smaller blocks are employed because larger sizes of blocks result in inefficient encoding processes, although 16×16 image element blocks are sometimes employed. According to contemporary known approaches to image encoding, when multiple different block sizes are used for encoding, it is customary practice to utilize a small variation in block sizes; moreover, block sizes are selected based upon how well movement can be compensated in an associated block area or based upon a encoding quality parameter, for example a target quality parameter. In general, higher encoded image quality requires smaller blocks which results in less data compression. Certain types of contemporary encoding can even result in an increase in data size, when error correction features such as parity codes and error correction codes are included.

From the foregoing, it will be appreciated that providing data compression of, for example, images and videos whilst preserving image quality is a contemporary problem which is not adequately addressed by known encoders and decoders, despite a large variety of codecs having been developed during recent decades. However, even bigger problems occur along the progress reached in sequencing human genomes and utilizing them in medical research and development. This is because of the increased need of storage and transfer of huge amounts of genomic data, which thus needs to be efficiently compressed. Yet further, Internet of Things (IoT) concerns devices that process large amounts of data, yet the individual batches of data are typically small in size.

These problems raised by new, disruptive technologies and big data require efficient ways of compression which known coding technology has not been able to sufficiently address.

Finally, it should be appreciated that contemporary codecs are typically able to compress only one type of data whereas the embodiments pursuant to the disclosure are capable of processing all types of data content as will be described in the following:

SUMMARY

The embodiments described herein seek to provide a decoder for decoding encoding input data representative of at least one data content item and generating corresponding decoded output data representative of the at least one data content item, wherein the decoded output data is decompressed in relation to the encoded input data without any substantial loss of quality occurring during decoding; the data is optionally any type of data, for example, at least one of: image data, video data, audio data, graphics data, economic data, mask data, measurement data multi-dimensional data (such as 3D), ECG, seismographic data, analog-to digital (ADC) converted data, biomedical signal data, genome data, ASCII, Unicode, textural data, text data, calendar data, mathematical data, binary data but not limited thereto.

Moreover, the embodiments described herein seek to provide a method of decoding encoded input data representative of at least one data content item and generating corresponding decoded output data representative of the at least one data content item, wherein the decoded output data is decompressed in relation to the encoded input data, without increasing loss of quality of content present in the encoded input data.

According to a first aspect of the present invention, there is provided a method of decoding encoded input data to generate corresponding decoded output data, the method including the steps of:

(a) processing the encoded input data to extract therefrom header information indicative of encoded data pertaining to individual blocks and/or packets included in the encoded input data, and information including data indicative of transformations employed to the individual blocks and/or packets;

(b) creating an initial set of individual blocks and/or packets based on received header data, and preparing a data field in a data storage arrangement for receiving decoded individual block and/or packet content;

(c) splitting or combining individual blocks and/or packets in the data field according to information indicative of splitting/combining;

(d) retrieving information describing the transformations and then applying an inverse of the transformations for decoding the encoded and compressed original block and/or packet data to generate corresponding decoded block and/or packet content for populating the data field; and (e) when the encoded input data has been at least partially decoded, outputting data from the data field as the decoded output data.

The method enables encoded input data to be decoded and decompressed in an efficient manner, without increasing loss of quality of content present in the encoded input data.

Optionally, the method further includes processing the encoded input data to extract decisions of an initial size of the individual blocks and/or packets, or one or more parameters describing data content and/or data type of the encoded input data, which is indicative of an initial size of the individual blocks and/or packets.

Optionally, the method further includes processing the encoded input data to extract information indicative of splitting and/or combining of the individual blocks and/or packets to provide decoded output data, the information containing at least one of: information indicative of executing splitting/combining, information indicative of direction of splitting/combining, information indicative of order of splitting/combining, information that the block in question has already reached its minimum/maximum size.

Optionally, the method further includes processing the encoded input data to extract information indicative of a plurality of mutually different transformations or combinations of transformations employed to individual blocks and/or packets.

Optionally, the method further includes decoding blocks and/or packets to a temporal series of data, wherein subdivision of the encoded input data corresponding to a given information to form a plurality of corresponding blocks is made dependent upon content present in one or more data preceding the given data within the temporal sequence of data.

Optionally, step (d) further includes retrieving supplementary information from a database arrangement for use when executing an inverse of said transformations, said supplementary information including at least one of: algorithms, indices, rules, tables, one or more transformation parameters.

Optionally, the method further includes retrieving information from the encoded input data indicative of the database arrangement for enabling decoding of the encoded input data to access said supplementary information employed.

Optionally, the method further includes employing for said inverse of the one or more transformations inverses of one or more of: a data base coding method, a DC-value coding method, slide coding method, a scale coding method, a line coding method, a multilevel coding method, an interpolation coding method, an extrapolation coding method, Discrete Cosine Transform (DCT), pulse code modulation (PCM), Differential Pulse Code Modulation (DPCM), Run-Length Encoding (RLE), Split run-length encoding (SRLE), bzip2-specific RLE, Entropy Modifier, Lempel-Ziv Obehumer (LZO), LZ77, LZMA, LUT coding methods, Variable Length Coding (VLC), Huffman-coding, arithmetic coding, range coding, transform coding, delta coding, O-Delta coding, D-Delta coding method, I-Delta coding method, P-Delta coding method, IntraMV coding method, InterMV coding method, color conversion coding method, quantization, wavelet transform, Hadamard transform, and linear transform.

Optionally, the method further includes decoding at least one of video, image, audio, graphics, economic data, mask data, multi-dimensional data (such as 3D), measurement data, text data, texture data, ECG, seismic, analog-to digital (ADC) converted data, biomedical signal data, genomic data, ASCII, Unicode, calendar data, mathematical data and binary information present in the encoded input data.

Optionally, the method is also capable of retrieving data elements corresponding to data blocks from a database.

Optionally, the method further includes receiving the encoded data from at least one of following destinations: a data memory device, a communication network, a memory card, data memory disks, local area communication networks (LANs), directly from an encoder.

Optionally step (b) of the method includes initially splitting the input data in a decoder, according to information included in the header, into one or more blocks based on at least one of:
(a) image resolutions;
(b) an amount of data;
(c) a content of data;
(d) maximum block or packet size;
(e) minimum block or packet size;
(f) a quality parameter;
(g) the dynamic range of the data; and
(h) whether the data is divisible into several channels or not (e.g., multichannel audio or color channels of an image, HDR data, 3D images, videos etc.)

It should be noted that even if typically the decoder gets the decisions about initial splits made by the encoder as ready-made decisions, in some cases the encoder can communicate to the decoder the grounds for such decisions, such as for example listed above, based on which the decoder knows how to execute the initial division of the data.

The splitting of input data can also include the division of data into separate channels to be processed, or the data can be processed with combined channels (if the correlation is large, and there are therefore benefits in doing so) in original format (interlaced), or by shifting the data order (progressive-to-interlaced), if the data was originally in planar format.

Optionally, the method includes utilizing only a single processing unit.

Optionally, the method includes utilizing only a single memory device.

It should be appreciated that the method takes place in a decoder that is beneficially one integrated unit which can be implemented with merely one memory and one processor. However, the embodiments pursuant to the disclosure also make it possible to utilize parallel processing, for example regarding data values, data blocks or data channels.

Optionally, the method includes employing for the inverse of the one or more transformations of one of more of: a data base coding method, a DC-value coding method, slide coding method, scale coding method, line coding method, multilevel coding method (a method disclosed in U.S. Pat. No. 9,245,353, the entire disclosure of which is incorporated herein by reference in its entirety), interpolation coding method (a method disclosed in US application no. US 2016/0142712 A1, the entire disclosure of which is incorporated herein by reference in its entirety), extrapolation coding method (a method disclosed in US application no. US 2016/0156933 A1, the entire disclosure of which is incorporated herein by reference in its entirety), Discrete Cosine Transform (DCT), pulse code modulation (PCM), Differential Pulse Code Modulation (DPCM), Run-Length Encoding (RLE), Split run-length encoding (SRLE, a method disclosed in U.S. Pat. No. 8,823,560, the entire disclosure of which is incorporated herein by reference in its entirety), bzip2-specific RLE, Entropy Modifier (a method disclosed in U.S. Pat. No. 8,754,791, the entire disclosure of which is incorporated herein by reference in its entirety), Lempel-Ziv Obehumer (LZO), LZ77, LZMA, LUT coding methods, Variable Length Coding (VLC), Huffman-coding, arithmetic coding, range coding, transform coding, delta coding, ODelta coding (a method disclosed in U.S. Pat. No. 8,810,439, the entire disclosure of which is incorporated herein by reference in its entirety), DDelta coding method, IDelta coding method, PDelta coding method (methods disclosed in WO 2016/012105 A1, the entire disclosure of which is incorporated herein by reference in its entirety), IntraMV coding method, InterMV coding method, color conversion coding method, quantization, wavelet transform, Hadamard transform, linear transform, but not limited thereto. Other types of transformations are also feasible to employ for the method.

It should be noted that optionally, transformation can also mean a combination of different transformations. As an example of such a combination of transformation to be applied is multilevel coding method where mask bits are converted using RLE to parameters and the method is called Multilevel RLE. Sometimes the transformation by default uses several transformations such as in DCT where there is typically also quantization performed, zigzag scanning and using ZRLE for the delivery of parameters.

It should be further noted that in some cases the encoder can already insert to the header the information of the inverse transformation to be employed at the decoder. In such a case, the decoder operates according to the header information and does not execute inverse transformation of the transformation communicated to it. As a yet further note, the fact that the decoder typically executes inverse transformation of the transformation employed at the decoder, does not mean that the transformation would be inverse as such. For example, it can happen that the encoder executes coding using inverse DCT, whereby the decoder is executing inverse of that, i.e. the «normal» DCT.

Optionally, the method includes decoding at least one of video, image, audio, graphics, economic data, mask data, multi-dimensional data (such as 3D), measurement data, text data, texture data, ECG, seismic, analog-to digital (ADC) converted data, biomedical signal data, genomic data, ASCII, Unicode, calendar data, mathematical data and binary information present in the encoded input data but not limited thereto.

Optionally, the method includes decoding multiple channels and/or layers in the encoded input data for providing at least one of: interactive video, commercial advertisements, a plurality of viewpoints during sports event reporting, interactive watermarks, interactive pattern recognition, and animated 2D/3D user interface buttons.

According to a second aspect of the invention, there is provided a non-transitory machine-readable data storage media having stored thereon a computer program, which, when executed by a computer processor, causes the computer processor to execute a method pursuant to the first aspect of the invention.

According to a third aspect of the invention, there is provided a decoder operable to decode encoded input data to generate corresponding decoded output data, wherein the decoder includes data processing hardware which is operable:
(a) to process the encoded input data to extract therefrom header information indicative of encoded data pertaining to individual blocks and/or packets included in the encoded input data, and information including data indicative of transformations employed to the individual blocks and/or packets;
(b) to create an initial set of individual blocks and/or packets based on received header data, and to prepare a data field in a data storage arrangement for receiving decoded individual block and/or packet content;
(c) to split or combine individual blocks and/or packets in the data field according to splitting/combining information;
(d) to retrieve information describing the transformations and then applying an inverse of the transformations for decoding the encoded and compressed original block and/or packet data to generate corresponding decoded block and/or packet content for populating the data field; and (e) when the encoded input data has been at least partially decoded, to output data from the data field as the decoded output data.

Optionally, the data processing hardware is further operable to process the encoded input data to extract decisions of an initial size of the individual blocks and/or packets, or one or more parameters describing data content and/or data type of the encoded input data, which is indicative of an initial size of the individual blocks and/or packets.

Optionally, data processing hardware is further operable to process the encoded input data to extract information indicative of splitting and/or combining of the individual blocks and/or packets to provide decoded output data.

Optionally, the data processing hardware is further operable to process the encoded input data to extract information indicative of a plurality of mutually different transformations or combinations of transformations employed to individual blocks and/or packets.

Optionally, the data processing hardware is further operable to decode blocks and/or packets to a temporal series of data, wherein sub-division of the encoded input data corresponding to a given information to form a plurality of corresponding blocks is made dependent upon content present in one or more data preceding the given data within the temporal sequence of data.

Optionally, element (d) further includes retrieving supplementary information from a database arrangement for use when executing an inverse of said transformations, said supplementary information including at least one of: algorithms, indices, rules, tables, one or more transformation parameters.

Optionally, the data processing hardware is further operable to retrieve information from the encoded input data indicative of the database arrangement for enabling decoding of the encoded input data to access said supplementary information used when earlier encoding the input data.

Optionally, the data processing hardware is further operable to employ for said inverse of the one or more transformations inverses of one or more of: a data base coding method, a DC-value coding method, slide coding method, a scale coding method, a line coding method, a multilevel coding method, an interpolation coding method, an extrapolation coding method, Discrete Cosine Transform (DCT), pulse code modulation (PCM), Differential Pulse Code Modulation (DPCM), Run-Length Encoding (RLE), Split run-length encoding (SRLE), bzip2-specific RLE, Entropy Modifier, Lempel-Ziv Obehumer (LZO), L77, LZMA, LUT coding methods, Variable Length Coding (VLC), Huffman-coding, arithmetic coding, range coding, transform coding, delta coding, O-Delta coding, D-Delta coding method, I-Delta coding method, P-Delta coding method, IntraMV coding method, InterMV coding method, color conversion coding method, quantization, wavelet transform, Hadamard transform, and linear transform.

Optionally, the data processing hardware is further operable to decode at least one of video, image, audio, graphics, economic data, mask data, multi-dimensional data (such as 3D), measurement data, text data, texture data, ECG, seismic, analog-to digital (ADC) converted data, biomedical signal data, genomic data, ASCII, Unicode, calendar data, mathematical data and binary information resent in the encoded input data.

Optionally, the decoder is implemented such that the data processing hardware is implemented using computing hardware operable to execute a software product.

Optionally, the decoder is operable to use an inverse of the transformations to decompress content associated with the blocks and/or packets, so that the decoded output data is larger in size than the encoded input data to be decoded.

Optionally, the decoder is implemented such that the blocks and/or packets are sub-divided and/or combined so that at least one of their representative parameters describing their content is substantially flat within their sub-divided and/or combined blocks and/or packets. The at least one representative parameter is, for example, color, amplitude, strength, number, or code of the sub-divided/combined blocks.

Optionally, the decoder is receiving the encoded data from at least one of following destinations: a data memory device, a communication network, a memory card, data memory disks, local area communication networks (LANs), directly from an encoder.

In the step (b) the decoder performs the initial splitting of the input data in an decoder, according to information included in the header, into one or more blocks based on at least one of:

(a) image resolutions;
(b) an amount of data;
(c) a content of data;
(d) maximum and minimum block or packet size;
(e) a quality parameter;
(f) the dynamic range of the data; and
(g) whether the data is divisible into several channels or not (e.g., multichannel audio or color channels of an image, HDR data, 3D images, videos etc.)

The splitting of input data can also include the division of data into separate channels to be processed, or the data can be processed with combined channels (if the correlation is large, and there are therefore benefits in doing so) in original format (interlaced), or by shifting the data order (progressive-to-interlaced), if the data was originally in planar format.

Optionally, the decoder includes utilizing only a single processing unit.

Optionally, the decoder includes utilizing only a single memory device.

It should be appreciated that a decoder is beneficially one integrated unit which can be implemented with merely one memory and one processor. However, the embodiments pursuant to the disclosure also make it possible to utilize parallel processing, for example regarding processing data values, data blocks or data channels.

Optionally, the decoder is operable to decode multiple channels and/or layers in the encoded input data for providing at least one of: interactive video, commercial advertisements, a plurality of viewpoints during sports event reporting, interactive watermarks, interactive pattern recognition, animated 2D/3D user interface buttons.

According to a fifth aspect of the invention, there is provided an electronic consumer product operable to receive and/or store input data, characterized in that the electronic consumer product includes a decoder pursuant to the fourth aspect for decoding the input data for generating decoded content for providing to at least one user of the consumer product.

Optionally, the electronic consumer product is at least one of: a mobile telephone, a cell phone, a tablet computer, a television, a portable media playing device, a camera, a personal computer, an editor, a transcoder, a scanner, a fax, a copy machine, a microphone, an audio card, a record player, a DVD player, but not limited thereto.

It will be appreciated that features of the invention are susceptible to being combined in various combinations without departing from the scope of the invention as defined by the appended claims.

BRIEF DESCRIPTION OF THE DRAWINGS

Embodiments of the present disclosure will now be described, by way of example only, with reference to the following diagrams wherein:

FIGS. 9 and 10 are example images and examples on how the selected minimum and maximum block sizes affect the segmentations of blocks inside init blocks, and also on how they affect the decoding of their content.

Figure 1:
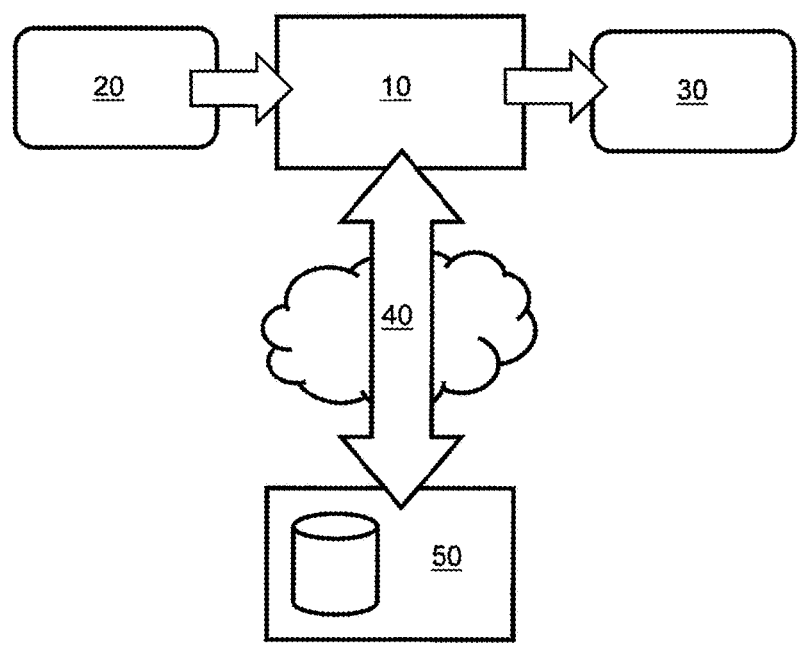
FIG. 1 is a schematic illustration of an embodiment of a decoder pursuant to the present disclosure.

In the accompanying diagrams, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing.

DETAILED DESCRIPTION

In overview, the embodiments are concerned with decoders and associated methods of decoding encoding input data to generate corresponding decoded output data. The method is concerned with receiving encoded input data representative of one or more data content items, and then processing the encoded input data by executing steps of:

(i) interpreting header information included in the encoded input data;

(ii) creating an initial set of individual blocks and/or packets based on received header data (ii) identifying block and/or packet information present within the encoded input data;

(iii) populating a data field with blocks and/or packets corresponding to the identified block or packet information;

(iv) identifying one or more transformations which have been used to generate the block and/or packet information; and (v) applying an inverse of the identified one or more transformations to decode the block and/or packet information to generate decoded data to populate the data field with decoded block or packet information, thereby providing the aforesaid decoded output data.

After having executed the step (iii), if it is found in the input encoded data that a given block or packet has been split or combined, the populated blocks or packets in the data field are correspondingly split or combined; such a feature enables the data field to be configured with an arbitrary template of blocks or packets which are subsequently amended, for example appropriately split or combined, during decoding of the encoded input data.

Moreover, the method includes processing the blocks and/or packets to generate decompressed encoded input data representative of the one or more images and/or the one or more audio signals or any other type of input data including but not limited to video, graphics, economic data, mask data, multi-dimensional data (such as 3D), measurement data, text data, texture data, ECG, seismic, analog-to digital (ADC) converted data, biomedical signal data, genomic data, ASCII, Unicode, calendar data, mathematical data and binary information present in the encoded input data.

The method is capable of employing inverse of multiple coding and entropy modifying methods, containing transformations, when decoding and decompressing data describing blocks of data. Different decoding methods can be used for different blocks of a given image, when favorable coding and compression performance is thereby achieved, depending upon information content of the different blocks. As there can be different coding methods applied to blocks or packets of same size in the encoding phase, there needs to be the selection of a coding method communicated in the encoded input data. Further, same coding method can be applied to blocks or packets of different size. It should be noted that even if the method pursuant to the disclosure as a whole contains plurality of coding methods, for one individual block or packet, during one round of iteration, there is however typically only employed one coding method.

Information regarding the splitting/combining data blocks or packets is communicated with the data, either in header or in the encoded input data. The information can contain bits to express individual splitting/combining decisions. Further, because the split/combine decisions enable segmentation, which defines the area identifiers for the blocks (i.e. the size, location and shape of each block), then this information can also be conveyed and transmitted e.g. with x and y coordinates, which would specify the sizes and locations of the blocks (and maybe even their shapes). When using x and y coordinates to transmit the split/combine information, it would be beneficial to delta code those x and y coordinate values separately. It will be appreciated that in addition to the aforementioned examples, there are also other ways to convey and transmit the size, location and shape of each block, gained from the split/combine decisions. What is essential is that the decoder needs to have the information in order to be able to segment the data correctly prior applying transformations communicated to the decoder.

Information describing the plurality of transformations employed when coding the blocks/packets is communicated in the encoded input data; this information is either included in the encoded input data, or the header data, or the input data can include a reference to one or more databases from where information of the transformations employed can be obtained. Coding methods that were employed can include one or more of: multilevel coding method, line coding method, scale coding method, slide coding method, interpolation coding method, extrapolation coding method, unchanged coding, IntraMV coding method, InterMV coding method, SRLE, EM, Odelta and range coding, but not limited thereto, and as will be elucidated in greater detail below. Optionally, splitting (namely sub-dividing) or combining init-blocks is also employed. This can be done separately for each channel or for multiple or all channels simultaneously.

It should be appreciated that during earlier encoding to generate the encoded input data by utilizing an encoding method implemented in an encoder, a selection of the sizes of the blocks is determined by an ease with which areas corresponding to the blocks can be encoded; for example, larger blocks are employed for areas of the one or more images which can be described with relatively few associated parameter values, namely the areas are substantially flat after the transformation, and smaller blocks are employed for areas of the one or more images which are difficult to encode on account of relatively abrupt spatial changes therein, thus requiring a larger amount of associated parameter values. Typically, flat areas are coded in larger blocks, thereby producing less encoded data, whereas coding such areas where the content varies a lot often requires using smaller blocks, thereby producing more encoded data per block area. It should be appreciated that the term "flat" means that the area in question is easily encoded, namely only a few bits are produced after the coding method has been applied. That is, after the transformation there are only a few parameters or no parameters at all. The parameters optionally pertain to one or more of: color, illumination, constant value, sliding parameter value, repetitive pattern, but are not limited thereto.

The blocks are optionally rectilinear in relation to areas of the one or more images which they represent, for example 64×64 elements, 32×16 elements, 4×20 elements, 10×4 elements, 1×4 elements, 3×1 elements, 8×8 elements, 1×1 element and so forth; optionally, the elements correspond to pixels present in the one or more images, but can be subject to scaling operations during encoding, namely each element corresponding to a corresponding plurality of pixels. However, other shapes of blocks are optionally employed, for example elliptical blocks, circular blocks, triangles and so forth. Moreover, by analogy, the encoding method can also be applied to encode one or more audio signals, wherein the one or more audio signals are subdivided into packets, and/or combined into packets, of variable temporal length, depending upon a nature of the audio signals corresponding thereto, and the packets are then encoded to generate encoded compressed output data; the packets are synonymous with aforesaid blocks but pertain to audio rather than image information. The encoding method is capable of concurrently encoding both audio information and image information, for example as in multimedia content, as well as any other type of data.

The degree of variation in the content of data can be measured by calculating e.g. the variance, the standard deviation, maximal and minimal values of amplitude, etc. If for example the variance is used as the meter, then it is beneficial to first divide the data in such a fashion that the less variation there is in the data and therefore the smaller the variance value is, the larger the resulting blocks should be. Vice versa, with more variance, i.e. with a lot of variation in the content, it is beneficial to divide data to smaller blocks. This can also be performed so that at first, data is divided into larger blocks, after which those blocks will be analysed further. In case there is lot of variance in the content of some of the large blocks, then those large blocks will be divided to smaller blocks based on variance in the content. However, this division always needs to be communicated from the encoder to the decoder, so that the decoder knows what was e.g. the standard deviation before decoding the data.

However, it is much more effective to divide the data already in the very beginning to smaller blocks and then to start combining them than to start with larger blocks and then to continue to divide them to smaller and smaller blocks, as it is probable that some splitting of blocks into smaller blocks will take place later anyway. Also, the quality parameter can have an effect on the initial division, that is, the better quality result is to be gained, the smaller initial blocks it is worth creating and vice versa.

During processing of the areas of the one or more images, for example, into corresponding blocks, the encoding method includes checking a quality of representation of information provided by the blocks relative to corresponding detail in the one or more images to compute a corresponding quality index; in an event that the computed quality index indicates, when compared against a reference quality threshold, that a selection of block sizes has been employed such that the quality of representation of data provided by the blocks is insufficient, the encoding method iterates back and uses progressively smaller blocks until the quality index indicates that the quality of representation is met as defined by the reference quality threshold. By such an approach, it is feasible to achieve data compression during encoding which is substantially lossless, depending upon the choice of a threshold value for the quality of representation of information. Optionally, the reference quality threshold is made dynamically variable, depending upon content present in the one or more images; for example, when the one or more images are a part of video sequence where there is rapid chaotic activity, the reference quality threshold can be relaxed during the chaotic activity for enabling an enhanced degree of data compression to be achieved. The chaotic activity can be, for example, random features such as flowing turbulent water, flames, falling snow, billowing smoke, ocean waves and so forth, wherein loss of information is not readily discernible when the encoded data is subsequently decoded in a decoder.

Determination of the size of the blocks in the aforesaid encoder can be optionally based upon one or more criteria as listed in Table 3. The criteria are merely examples about what an encoder may base its decision on. The criteria are not essential to a decoder, as the decoder supports certain operations (split/combine bits, method selection, transformations) based on decisions made by the encoder and the decoder merely operates accordingly, in order to reach the desired (selected by the encoder) end result. This should be differentiated from the previously mentioned optional procedure regarding initial division of the input data, where the encoder can communicate to the decoder except decisions of such a division also the grounds for such decisions, and the decoder then knows based on the communicated information how to execute the initial division. But even in such a case, the actual decision has been made in the encoder.

TABLE 3

Criteria for split selection and/or combining selection of blocks during encoding

| Criterion number | Criterion |
|---|---|
| 1 | Variance or standard deviation of block data as derived from a corresponding area of an input image |
| 2 | Mean or sum of an absolute difference between data represented by a given block and a prediction of its value |
| 3 | Variance or standard deviation of an absolute difference between data represented by a given block and a prediction of its value |
| 4 | Transformations used by the selected coding methods |
| 5 | Estimated bit amount that the coding method would produce |
| 6 | Estimated decoding distortion that coding method would produce |
| 7 | Estimated RD value based on the decoding distortion and the bits that the coding method would produce |
| 8 | Estimated RD value of the coding method compared to that of the other coding methods with the blocks of same size |
| 9 | Estimated RD value of the coding method compared to that of the other coding methods with the blocks of different size |

Optionally, predictions in Table 3 are based upon known rules employed when encoding data, such as for example one or more images. Alternatively, the predictions in Table 3 are based upon provided configuration information, for example as provided from selected database references, from prediction directions, from movements of block coordinates within the one or more images, and so forth. A use of a variance or a standard deviation is an approach employed to provide compression of information by describing a mutual relationship of elements included within a given corresponding block. In many situations, predictions of block data with associated encoding is itself sufficient when performing encoding, but it is optionally desirable to include code prediction error data within the prediction to improve an accuracy of the prediction. In a simple example of encoding, a simple data prediction method is employed, for example a mean value, namely "DC" value, of pixels or elements within a given block are to be delivered in the encoded output data, namely encoded input data to the decoder.

Splitting areas, alternatively combining areas, of one or more images, for example, provided as input data to an encoder implementing the aforesaid method is optionally implemented according to any manner which provides both compression and also substantially maintains image quality, namely is substantially lossless during encoding. The encoding method applies various strategies to such splitting and/or combining of areas. For example, if a given block includes considerable information, it is optionally split into a plurality of corresponding smaller blocks that are relatively "flat", namely substantially constant, in relation to their content such that they individually include relatively little information. When the encoding method pursuant to the present invention is applied to at least one or more images and/or one or more audio signals, encoding quality and encoding noise in the encoded output data are optionally employed to control a manner in which splitting up of input images and audio input signals into blocks and packets respectively occurs. However, it will be appreciated that other types of data content items can be processed in a similar manner, for example at least one of: image data, video data, audio data, graphics data, economic data, mask data, multidimensional data (such as 3D), measurement data, seismographic data, analog-to-digital (ADC) converted data, biomedical signal data, genome data, text data, textural data, calendar data, mathematical data, binary data but not limited thereto.

It will be appreciated that the actual splitting and/or combination can take place in various forms and directions, such as diagonally, horizontally, vertically etc. As a result of for example splitting 1. . . N sub-blocks are created. The sub-blocks can be of the same or of different size. Furthermore, the sub-blocks can be of the same shape or of different shape. The size or shape does not matter as long as the encoder and the decoder can function in a similar way, with or without related additional information transmitted to them. If selections for splitting and/or combination direction were made in the encoder, then they need to be signaled to the decoder with the encoded data. It can also be that the order and direction of splitting/combinings is fixed, whereby no signaling is needed.

Optionally, the noise in the encoded output data is based on at least one of:
(i) noise present in a present block or packet;
(ii) noise present in one or more previous blocks or packets generated by the method; and
(iii) previous images.

Optionally, when a given input image is split into areas and corresponding blocks, the encoding method analyses the blocks thereby generated to determine whether or not any of the blocks can be combined together, subject to aforesaid quality criteria, in order to obtain a greater degree of data compression in the encoded output data. In the foregoing, the encoded output data includes information associated with the blocks which defines locations of their corresponding areas in their original images in the input data to be encoded.

When encoding the one or more images present in the input data to be encoded using the method, data associated with the input images can be either quantized or downsampled so as to achieve compression benefits. Quantization reduces the dynamic range of the samples (or the transformation values), and it is executed for every sample (or transformation value) separately, whereas downsampling refers to decreasing the sampling rate, i.e., less samples are taken from a block of data. These methods are therefore related, but not the same.

For example, the data can be down-sampled in ratios of 2×1:1, 2×2:1, 1×2:1, 4×1:1, or similarly quantized prior to being subject to aforementioned encoding methods. Optionally, such down-sampling or quantizing is performed in response to a desired quality of encoding desired in the compressed encoded output data generated from applying encoding methods. Optionally, larger blocks processed by the encoding method are less downsampled or quantized than smaller blocks; in other words, a degree of quantization or downsampling employed is optionally decreased as block sizes are increased. Optionally, during encoding, a scaling factor for down-sampling or quantization employed, is made dynamically variable, for example in response to a nature of content in a sequence of images, for example video, to be encoded.

During encoding of blocks pursuant to the encoding method, each block has various representative parameters which describe its contents. These parameters are conveyed when encoding via various "channels". For example, color channels describing blocks of an image can include one or more of: black/white (B/W), Y, U, V, red (R), green (G), blue (B), Cyan (C), Magenta (M), Y and K. Moreover, the input images for encoding and the blocks can be optionally processed when executing the encoding method using a variety of potential color or pixels formats, for example Y, YUV420, YUV422, YUV444, RGB444, G and CMYK contemporary standards and formats. Moreover, the format is optionally planar, interleaved, line planar and so forth. Moreover, the encoding method is capable to change format of images and/or blocks as well as to combine or separate channels when performing encoding activities; for example, an original image is in an interleaved RGB format and is encoded using methods of encoding to generate encoded output data in YUV420 format or vice versa. It will be appreciated that changing the format and combining or separating channels can be performed also for audio data, as well as for other types of data.

Bit depth, namely dynamic range of a pixel when implementing the aforesaid encoding method, can be in a range of 1-bit to 64-bit resolution. Optionally, different pixel colors or audio channels can be encoded with mutually different resolutions, provided that encoding quality criteria and compression performance of the encoding methods is satisfied.

The encoding methods are optionally implemented using encoding parameters and encoding rules and/or tables which are stored on a database and which are accessed when performing encoding activities. Optionally, the database is created during the encoding process and delivered for use when implementing the method via an encoder. For example, motion compensation during encoding can be implemented using delivered databases of information to the encoder. The encoder is operable to encode original pixel information present in the input data and/or encode prediction error information. Using database information when encoding input data to generate corresponding encoded output data enables the encoder to adapt to revisions in encoding standards of parameters, tables and similar utilized for encoding. Coding approaches which can be adopted when implementing the encoding methods optionally include one or more of: a data base coding method, a DC-value coding method, slide coding method, scale coding method, line coding method, multilevel coding method, interpolation coding method, extrapolation coding method, Discrete Cosine Transform (DCT), pulse code modulation (PCM), Differential Pulse Code Modulation (DPCM), Run-Length Encoding (RLE), Split Run-Length Encoding (SRLE), bzip2-specific RLE, Entropy Modifier, Lempel-Ziv Obehumer (LZO), LZ77, LZMA, LUT coding methods, Variable Length Coding (VLC), Huffman-coding, arithmetic coding, range coding, transform coding, delta coding, ODelta Coding method, DDelta coding method, IDelta coding method, PDelta coding method, IntraMV coding method, InterMV coding method, color conversion coding method, quantization, wavelet transform, Hadamard transform, linear transform, but not limited thereto. Optionally, the coding approaches include any combination of aforementioned examples of coding methods, namely a plurality of coding transformations are beneficially employed, as well as plurality of parameters, for blocks and/or packets, depending upon information content of the blocks and/or packets. It should be appreciated that typically at least two coding methods, namely transformations, are employed when implementing the method pursuant to the disclosure but it is not required that the two are from the mentioned listing. Instead, there can be plurality of methods used, of which only one is included in the exemplary listing. Yet further, in respect of individual block, only one coding method is typically employed.

When a coding approach such as Huffman encoding is employed, such coding uses fixed tables of encoding parameters or delivered tables of coding parameters. The decoder is implemented using computing hardware having data storage arrangements, wherein optimized tables of decoding parameters can be stored in the data storage arrangements for future use when performing decoding operations.

Reference addresses for enabling a decoder to access databases for obtaining suitable parameters for decoding the encoded output data from the encoder are included in the encoded output data. Optionally, the databases are accessible via a communication network, for example via the Internet. Optionally, the databases are supported via cloud computing arrangements. When the method implemented in the encoder utilizes mathematically generated databases, the databases can optionally be DC value, 1D/2D-linear transition, 1D/2D-curved transition, a 1D/2D transformation function or some known image block or audio packet structure.

The method of encoding when executed on an encoder is operable to encode input data to generate encoded output data, wherein the encoded output data can be output as a bit stream, alternatively stored in data storage media, for example as a data file. Moreover, the encoding method is capable of being utilized in a range of possible applications; beneficially, a header for video, image, image block, audio or audio packets which includes supplementary information, such as version number, size of data for the video, image or packet, quality factor threshold employed when encoding, maximum and/or minimum block or packet size, encoding approaches applied, namely types of transformations employed, tables of encoding parameters, and any other information for assisting subsequent decoding processes pursuant to this disclosure. Optionally, information that does not vary between blocks is not included for obtaining an enhanced degree of data compression in the encoded output data, or is included at a higher level in the encoded output data, for example at a header or a sub-header level. Table 4 provides a hierarchical order of levels which can be employed in the encoded output data generated by the encoder, to be communicated to the decoder.

TABLE 4

Order of levels in encoded input data, from high to low

| Level order | Information associated with level |
| --- | --- |
| High | Video |
| | groups of images |
| | Image |
| | groups of macro blocks |

TABLE 4-continued

Order of levels in encoded input data, from high to low

| Level order | Information associated with level |
|---|---|
| Medium | macro block |
|  | groups of blocks |
|  | Block |
|  | groups of microblocks |
| Low | Microblock |

Optionally, the encoding method is operable when executed to select and to deliver information pertaining to one or more levels in the encoded output data, for example dependent upon a field of application of the method, for example consumer video products, professional image compression apparatus for survey use, X-ray imaging apparatus, and magnetic resonance imaging (MRA) apparatus. Similar considerations pertain to orders of levels in encoded output data when the encoding method is employed to encode audio data; there can be employed headers for audio, groups of packets, packets, sub-packets, groups of waveform segments, and waveform segment.

It should be appreciated that the encoding method can have been designed to encode data in such a way that it is given to the method, i.e. with the given parameters. However, nothing prevents using the sub-methods of the main method, i.e. the transformations, to format and encode the data in several phases iteratively, in such a way that as a result of some sub-method/transformation the generated residual shrinks smaller and smaller by each iteration, and may even vanish. For the decoder this means that the decoder may receive the block data in such a way that first, some coarse information is received and then, iteration by iteration, the information becomes more exact. However, it would be advantageous if every block could be processed with one single sub-method/transformation, in which case there should be a sufficient amount of different sub-methods/transformations available, in order to avoid re-transforming the residual. In either cases, it is important for the decoder to get informed of transformations employed (method selection) as well as the block sizes used (segmenting information). This information is beneficially delivered to the decoder in the encoded data in form of MethodBits and Split/Combine Bits. Information about amount of iterations as well as sub-methods are also received via method selection information.

Regarding the methods (transformations), the information to the decoder is beneficially communicated via Methodbits. The Methodbits are needed because several different methods (transformations) may be used for the blocks of the same size. The method bits express which method was used for the block in question, and thus the decoder will be able to use the corresponding inverse transformation(s) when decoding the block(s).

It should be appreciated that the same method selection code number, namely index of the transformation, may indicate an entirely different method for different-sized blocks. Therefore, the decoding of method selection information may depend on the block size, just like encoding of the method selection at the encoder depends on the block size. Often, the individual pieces of method selection information, namely indices of transformations, for different-sized blocks are signaled so that they are compressed separately. Therefore, it is essential for the decoder to know where it can find the particular piece of method selection information (index of transformation), for the current block. It is possible to find out this information once the block size has been established.

It should be noted that the encoder often makes its split decisions for the following reasons: when the encoder has first performed different transformations, then it will, based on the results of those transformations, select such methods and split/combine decisions which typically minimize the Rate Distortion (RD) value, namely the amount of encoded bits (i.e. rate) and the errors produced to the reconstructed decoded data (i.e. distortion). Those decisions can be optimized at one go with a very large amount of different alternatives, or they can be optimized recursively in such a way that one decision is made at a time, thereby attempting to anticipate also the future consequences of that decision. The first approach makes it possible to reach a local optimum, but it often requires a very large amount of resources. The second approach requires a lot less resources, yet probably reaches a good end result. For the decoder or the decoding process, it makes no difference as to how the encoder has made its decisions, because the decoder merely receives those decisions, e.g. in the header the sizes of the init block and of the minimum block, and in the actual bit streams e.g. the split bits, the method bits and the values and parameters used by the methods.

It should be appreciated that the input data to the encoder employed can be original data, pre-processed data or residual data, but the method produces only the encoded output data. This encoded data can later be decoded into a similar format as the input data given to the encoder was. Therefore, if the given input data was already processed data or residual data, then the possibly needed counter-operations are no longer the responsibility of the method, but of the system using the method. In other words, the method was primarily developed to implement the entire coding solution, and therefore, beneficially, the given input data is original data, and not for example prediction error generated by motion estimation or intra-prediction, for some data block. Motion estimation (namely InterMV coding method) or intra-prediction (namely IntraMV coding method) could be used as a sub-method/transformation in this method, but in such a case, it would be beneficial if they would not yield a significant residual, so that their residual would not have to be re-transformed, with new transformations. At the decoder, after the decoder has decoded the data, inverse of these operations are then executed to the output data of the decoder. It should be appreciated that sometimes it is additionally desired to transcode the data into another format at the decoder, even though such operation had not been done to the original input data prior encoding.

The encoded output data from the encoder are communicated and/or stored, and eventually are received as encoded input data to a decoder pursuant to the present disclosure. The decoder then implements a method of decoding the encoded input data pursuant to the present disclosure. In the following, the method is described in detail, step-by-step, with help of Figures describing the different phases of the method.

Referring to FIG. 1, there is shown an illustration of a decoder pursuant to the present disclosure. The decoder is denoted by 10 and is operable to receive encoded input data 20, for example encoded output data from the aforementioned encoder, and to decode the encoded input data 20 by employing a decoding method pursuant to the present disclosure to generate corresponding decoded decompressed output data 30. The output data 30 is decoded in a substantially lossless manner as aforementioned. Optionally, the decoder 10 is coupled via a communication network 40 to a database arrangement 50 whereat one or more algorithms, transformation parameters, their indices, tables and/or rules for decoding the encoded input data 20 are stored.

In operation, the decoder 10 receives the encoded input data 20, optionally derives decoding information from the database arrangement 50 via the communication network 40, and then proceeds to decode the encoded input data 20 to generate the decoded decompressed output data 30. Optionally, the encoded input data 20 includes at least one of: encoded audio, one or more encoded images, encoded video, encoded graphics, encoded economic data, encoded mask data, encoded multi-dimensional data (such as 3D), encoded measurement data, encoded text data, encoded texture data, encoded ECG, encoded seismic data, encoded analog-to digital (ADC) converted data, encoded biomedical signal data, encoded genomic data, encoded ASCII data, encoded Unicode data, encoded calendar data, encoded mathematical data and encoded binary information present in the encoded input data but not limited thereto. Optionally, the encoded input data 20 includes headers, encoding information as well as encoded data.

The encoded input data 20 can be streamed from an encoder, for example via a communication network arrangement to one or more data storage devices or decoders, or retrieved directly from machine-readable data storage media, for example server hard drive disk storage, portable solid-state memory devices and so forth.

The decoder 10 can be implemented as hardware, for example via one or more PGLA (Programmable Gate Logic Array), via one or more software applications executable upon computing hardware, or any mixture of hardware and software, for example a parallel processing engine. The decoder 10 can be employed in multimedia products, computers, mobile telephones ("cell phones"), Internet services, video recorders, video players, communication apparatus and similar devices. The decoder 10 is optionally employed in conjunction with image capture systems, for example surveillance cameras, hospital X-ray systems, hospital MRI scanners, hospital ultrasound scanners, aerial surveillance systems and similar apparatus which generate large quantities of image data wherein lossless compression is desired so as to preserve fine information in the images whilst rendering the quantities of image data manageable for data storage purposes.

The decoder 10 can be used with known apparatus for image processing, for example in conjunction with an image/video processor as described in U.S. Pat. No. 8,169,547 herewith incorporated by reference in its entirety, for example in conjunction with an image generator as described in U.S. Pat. No. 8,649,427 herewith incorporated by reference in its entirety, and for example with a pattern recognizer as described in U.S. Pat. No. 8,615,137 herewith incorporated by reference in its entirety.

Figure 2:
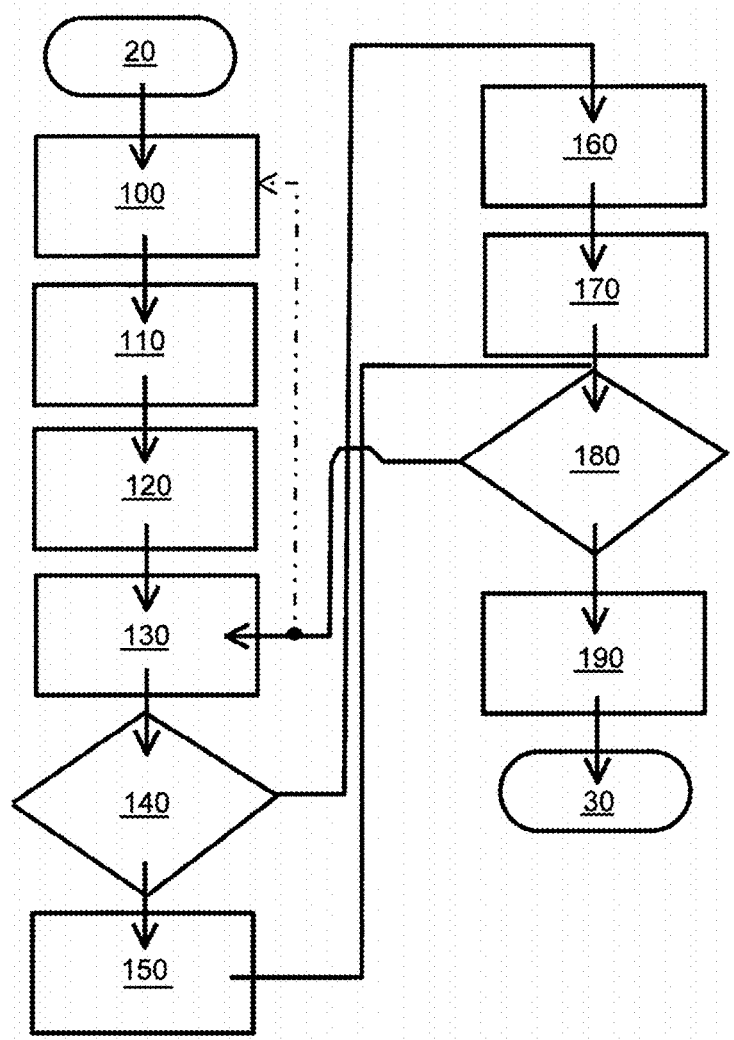
FIG. 2 is a flow chart of steps of a method of decoding encoded input data representative of at least one data content item to generate corresponding decoded output data, wherein the decoded output data is decompressed relative to the encoded input data without substantial loss of quality occurring during decoding; the data content item can include at least one of: image data, video data, audio data, graphics data, multidimensional data (such as 3D), economic data, mask data, measurement data seismographic data, analog-to-digital (ADC) converted data, biomedical signal data, genome data, ASCII, unicode, text data, textural data, calendar data, mathematical data, binary data but not limited thereto.

A method of decoding encoded input data using the decoder 10 of FIG. 1 will now be described with reference to FIG. 2. In FIG. 2, steps of a method of decoding encoded input data 20 are denoted by 100 to 190.

In a first step 100, the method of decoding includes receiving encoded input data for blocks/packets, such as image, video and/or audio, but not limited thereto, for example for receiving the aforesaid encoded input data 20.

In a second step 110, executed after the first step 100, the method includes finding and optionally decoding header information present in the encoded input data 20, for example parameters describing image size, and optionally one or more compression transformations which have been employed when generating the encoded input data 20, for example Range coding, RLE and/or Huffman algorithms. It should be appreciated that the header data does not necessarily need to be compressed, or encoded, in which case it does not need to be decompressed, or decoded, at the decoder, but the information therefrom is merely identified.

It should be further appreciated that even if in the following it is talked about header data for obtaining information regarding segmentation of blocks and/or packets as well as regarding coding methods, namely transformations, employed to them, the information does not necessarily need to be in the header data but it can be included within the encoded data. The information can be in its own data stream but typically the information is communicated in the headers of the specific data streams, instead of the header data of the whole input data, such as for example an image to be encoded. Those headers of the streams often contain also information of the amount of the encoded input data in the respective stream and optionally also information of the amount of the decoded output data, which equals to the input data prior it was encoded. When the information is communicated in the data streams instead of the header data for the input data as a whole, then the data stream in question naturally needs to be decoded, and decrypted, prior the information communicated therein is available for use.

In a third step 120, executed after the second step 110, the method includes creating an initial set of blocks and/or packets for receiving decoded data from the second step 110. Thereafter, in a fourth step 130, the method includes analysing the header data from the second step 110 to determine splits or combinings of blocks and/or packets. In a fifth step 140 executed after the fourth step 130, the method includes determining whether or not a given block or packet is split or combined; in an event that the given block or packet is not split or combined, the method progresses to a seventh step 160; in an event that the given block or packet is split or combined, the method progresses to a sixth step 150 which is concerned with splitting or combining blocks or packets involving a creation of one or more new blocks or packets. Upon execution of the sixth step 150, the method progresses to a ninth step 180.

In the seventh step 160, the method includes processing block and/or packet information. In an eighth step 170, executed after completion of the seventh step 160, the method includes decoding encoded data corresponding to blocks or packets included in the encoded input data 20 by applying inverse transformations whose identities are determined for example from the header information derived from the second step 110, or from the optionally decoded data stream containing method selection, namely information of transformations employed, to the individual blocks. Optionally, the one or more inverse transformations can be obtained by the decoder 10 communicating via the communication network 40 with the database arrangement 50, for example a database arrangement 50 that provided transformation algorithm support for earlier encoding the encoded input data 20.

It should be noted that the determining of the identities of the inverse transformations referred to above can be done except from several locations also in several ways. Namely, the data indicative of transformations can contain except information of the actual transformations employed, or the inverse transformations to be employed at the decoder, also parameters or rules describing the transformations, and optionally also the index of the transformation in question. As an example, such an index 'n' could be used and signalled to refer to the use of a DCT transformation. Or, an index 'n' can be used to refer to the DCT coding method for the blocks of the size 8×8, but for the blocks of the size 4×4 the index 'n' can refer to use of a line coding method whereas for the blocks of the size 4×4 the DCT method would be signalled with an index 'm''. Alternatively, in case there is no DCT method used for the 4×4 blocks, there is no need for its own index.

During the eighth step 170, the blocks and/or packets generated in the third step 120, and optionally split and/or combined in the fourth, fifth and sixth steps 130, 140, 150 respectively, are populated with decoded block and/or packet data generated in the eighth step 170, wherein the decoded block and/or packet data optionally becomes decompressed. In the aforesaid ninth step 180, the method includes checking whether or not a last initial block, a last block, a last packet or a last frame has been reached; in an event that the last block and so forth has not been reached, the method returns back to the first step 100 or the fourth step 130; in an event that the last block and so forth has been reached, the method proceeds to a tenth step 190 wherein decoding of block or packet has been completed, whereafter the method includes outputting the decoded output data 30, namely a decoded and decompressed version of the encoded input data 20. It is also possible to jump directly from the second step 110 to the eight step 170, if the header information shows that the block or packet is similar than the previous block or packet or the block, such as for example an image, is e.g. black in colour. It should be appreciated that all of the decoded data that can be written to the file or streamed out is beneficially generated as early as possible to avoid extra buffering and latencies when implementing the "block decoding" method pursuant to the disclosure. The block decoding method implies that the method can be implemented even block-by-block, so that the method is executed one block, or few blocks, at the time. However, more beneficially, the method proceeds with one initial block at the time, namely all such blocks that have originally been part of the same initial block, are proceeded from the beginning to the end, whereafter the method continues to proceed with next initial block.

Figure 3:
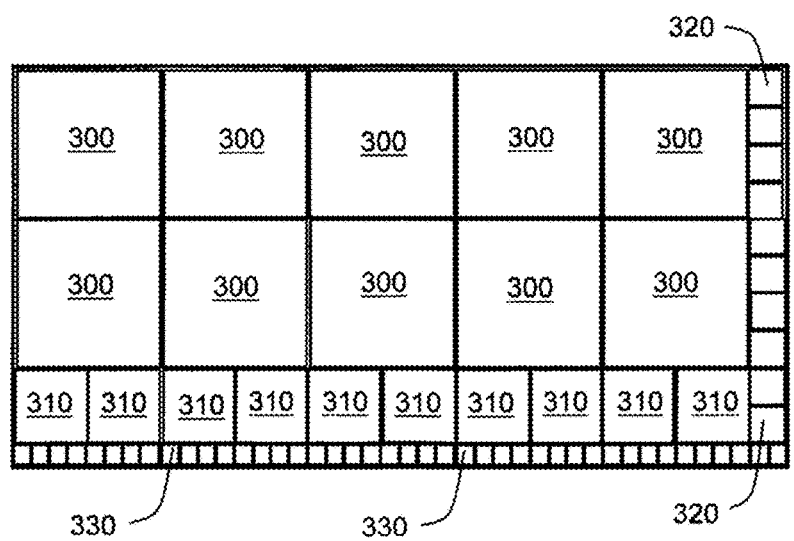
FIG. 3 is an example partitioning of an image into areas corresponding to blocks for decoding using a method whose steps are illustrated in FIG. 2.

Referring next to FIG. 3, from the foregoing, it will be appreciated that the method of encoding employed to generate the encoded input data 20, when appropriate, generates a variable block or packet size for providing an optimal solution between data compression in the encoded input data 20 and substantially lossless compression, namely substantially without discernible loss. In FIG. 3, it is a question of coding an image where large coding blocks 300 are employed for an upper left hand corner of a given image, whereas smaller blocks 310, 320, 330 are required along right-hand-side and lower edge areas of the image for more accurately providing encoding of these areas. In the encoded input data 20, parameters describing image content of the blocks 300, 310, 320, 330 and the position of the blocks within the image are included in the encoded input data 20. Encoding methods employed for encoding the blocks 300, 310, 320, 330, for example different methods for different blocks 300, 310, 320, 330, are also defined in the encoded input data 20. The distribution of the blocks 300, 310, 320, 330 will vary depending upon spatial distribution of content within the images to be encoded.

The decoder 10 is operable, for example, to cope with decoding encoded data from a scheme as depicted in FIG. 3. Optionally, the computing hardware of the encoder 10 is implemented as a plurality of data processors which are capable of operating in a concurrent manner to decode encoded data corresponding the blocks and/or packets, thereby increasing a rate at which the encoded input data 20 can be decoded to generate the decoded output data 30; for example real-time decoding of video streams thereby becomes feasible. A FIG. 3 shows example of the initial split of blocks in the image that is generated in the third step 120 of decoder (second step 110 in encoder). It is not necessarily required that specific information about the initial split is signaled from the encoder to the decoder, because the initial split can be based, for example, upon a size of the image. When a real split of a block is performed in the fifth step 140 in the encoder then that information is needed to be delivered from the encoder to the decoder, in manners different from those described earlier. Decoder decodes this delivered information in the fourth step 130 and does splitting and/or combining of blocks or packets decision in the fifth step 140 based on that decoded information.

In the foregoing, the following abbreviations have been used as given in Table 5. These various encoding formats are all potentially relevant for use when implementing the decoder 10, depending upon desired performance of the decoder 10.

TABLE 5

Some abbreviations for decoding transformations useable when implementing embodiments of the present disclosure

| | | | |
|---|---|---|---|
| 1D | 1-Dimensional (e.g. for a signal or packet) | MAD | Mean Absolute Difference |
| 2D | 2-Dimensional (e.g. for a block, image, stereo or multichannel audio) | MP3 | MPEG-1 Audio Layer 3 |
| 3D | 3-Dimensional (e.g. for video, stereo image, multichannel image) | MPEG | Motuion Picture Experts Group |
| AAC | Advanced Audio Coding | MSD | Mean Square Difference |
| AVC | Advanced Video Coding | MVC | Multiview Video Encoding |
| BMP | Bitmap - file format | PCM | Pulse Code Modulation |
| DC | Direct current | PNG | Portable Network Graphics |
| DCT | Discrete cosine transform | RLE | Run-Length Encoding |
| DPCM | Differential Pulse Code Modulation | SAD | Sum of Absolute Differences |
| FLAC | Free Lossless Audio Codec | SSD | Sum of Squares Differences |
| GIF | Graphic Interchange Format | TIFF | Tagged Image File Format |
| JPEG | Joint Photographic Experts Group | VLC | Variable Length Coding |
| JPEG XR | JPEG eXtended Range | VQ | Vector Quantization |
| LZO | Lempel-Ziv transform based coding method | EM | Entropy Modifier |
| ODelta | ODelta coding method | SRLE | Split Run-Length Encoding |

It should be noted that the Table is not exclusive list of decoding (namely inverses of encoding) transformations useable when implementing embodiments of the present disclosure.

The method of decoding pursuant to the disclosure, for example as depicted in FIG. 2, is capable of, via layer and channel encoding executed in the decoder 10, supporting interactive video presentations for providing new types of content delivery services, for example interactive commercial advertisements, different viewing perspectives when streaming live sports activities such as Formula 1 and so forth, and movies. For example, the decoder 10 allows for movies with localized subtitle layers, interactive watermarks, interactive pattern recognition, animated 2D/3D user interface (UI) buttons and so forth.

An Example

Simplified example of decoding an encoded image is described below. Based on this embodiment the decoder receives information content from a given encoder (for example as streamed or as file). According to example the information content is in a form of file consisting of following information fields and content:

Imagesize: 120×80 pixels
InitialBlocksize: 40×40 pixels
SplitBit: 0 0 1 0000 0 1 0010 0000 1 1000 0000
MethodBits: 0 0 1 0 0 0 0 0 0 0 0 0 0 0 0 0 0 0 0 0
Values: 10 10 20 25 15 20 10 10 10 10 10 10 5 10 5 5 5 5 5 5 10 5 5 5

Where:

Imagesize describes the size of the image to be decoded. The size of the image can be arbitrary; however, in this specific example it is 120×80 pixels which means that the initial block size is 40×40 because there are 3×2 blocks in the grid in the entire image.

InitialBlocksize describes what is a size of "basic" initial blocks. Depending on the implementation the InitialBlocksize can be fixed (such as 40×40 in this example) or it can vary (20×20 if original image size in the example were 60×40, 80×80 if original image size in the example were 240×160 etc). It might not be needed to send Initialblocksize information in case using default values in decoder and encoder or in case of using values that vary based upon data size, such as for example an image size, in adaptive manner similarly in encoder and decoder.

SplitBit values of "0" indicate that said block will not be split and value "1" indicates that said block will be split. In case of spitting the block to sub blocks "1" will be followed by rules on whether to split sub block or not;

Methodbits describe what to do with each block. As an example "0" can refer to filling block with uniform colour, "1" might refer to applying colour gradient to a block; and Values describe value to be applied to each Methodbit, value can be for example colour value or for example rules on filling gradients or for example pointer to database containing instructions on how to fill the block. In example value 10 corresponds to blue, value 5 to green and values 15, 20, 25 to different intensities of red.

Figure 4:
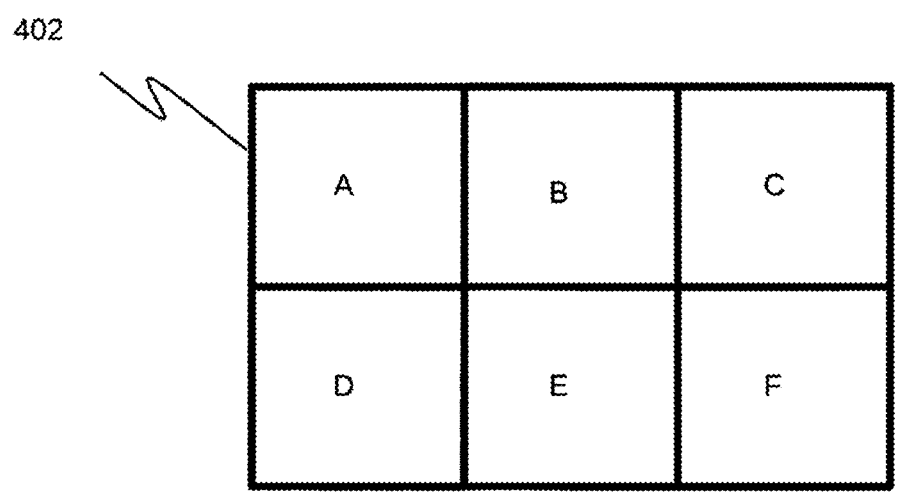
FIG. 4 is an example of initial partitioning an example image to be decoded using methods of embodiments.

In first step of decoding an image an image area of 120×80 pixels is resented from memory of the device where decoding takes place. The image area 402 is split to six 40×40 init blocks as shown in FIG. 4. Said blocks are marked with letters A, B, C, D, E and F for clarity purposes.

In second step of decoding the image Splitbit information content (0 0 1 0000 0 1 0010 0000 1 1000 0000) is used to split image area 402 to further blocks.

The bit number 1 of Splitbit information content is "0" indicating that the block A will not be split further.

The bit number 2 of Splitbit information content is "0" indicating that the block B will not be split further.

The bit number 3 of Splitbit information content is "1" indicating that the block C will be split to sub blocks.

The bit number 4 of Splitbit information content is "0" indicating that sub block 1 (later C1) of the block C will not be split further.

The bit number 5 of Splitbit information content is "0" indicating that sub block 2 (later C2) of the block C will not be split further.

The bit number 6 of Splitbit information content is "0" indicating that sub block 3 (later C3) of the block C will not be split further.

The bit number 7 of Splitbit information content is "0" indicating that sub block 4 (later C4) of the block C will not be split further.

The bit number 8 of Splitbit information content is "0" indicating that the block D will not be split further.

The bit number 9 of Splitbit information content is "1" indicating that the block E will be split to sub blocks.

The bit number 10 of Splitbit information content is "0" indicating that sub block 1 (later E1) of the block E will not be split further.

The bit number 11 of Splitbit information content is "0" indicating that sub block 2 (later E2) of the block E will not be split further.

The bit number 12 of Splitbit information content is "1" indicating that the sub block E3 will be split to sub blocks.

The bit number 13 of Splitbit information content is "0" indicating that sub block 1 (later E31) of the sub block E3 will not be split further.

The bit number 14 of Splitbit information content is "0" indicating that sub block 2 (later E32) of the sub block E3 will not be split further.

The bit number 15 of Splitbit information content is "0" indicating that sub block 3 (later E33) of the sub block E3 will not be split further.

The bit number 16 of Splitbit information content is "0" indicating that sub block 3 (later E34) of the sub block E3 will not be split further.

The bit number 17 of Splitbit information content is "0" indicating that sub block 4 (later E4) of the block E will not be split further.

The bit number 18 of Splitbit information content is "1" indicating that the block F will be split to sub blocks.

The bit number 19 of Splitbit information content is "1" indicating that the sub block F1 will be split to sub blocks.

The bit number 20 of Splitbit information content is "0" indicating that sub block 1 (later F11) of the sub block F1 will not be split further.

The bit number 21 of Splitbit information content is "0" indicating that sub block 2 (later F1) of the sub block F1 will not be split further.

The bit number 22 of Splitbit information content is "0" indicating that sub block 3 (later F13) of the sub block F1 will not be split further.

The bit number 23 of Splitbit information content is "0" indicating that sub block 4 (later F14) of the sub block F1 will not be split further.

The bit number 24 of Splitbit information content is "0" indicating that sub block F2 will not be split further.

The bit number 25 of Splitbit information content is "0" indicating that sub block F3 will not be split further.

and

The bit number 26 of Splitbit information content is "0" indicating that sub block F4 will not be split further.

Figure 5:
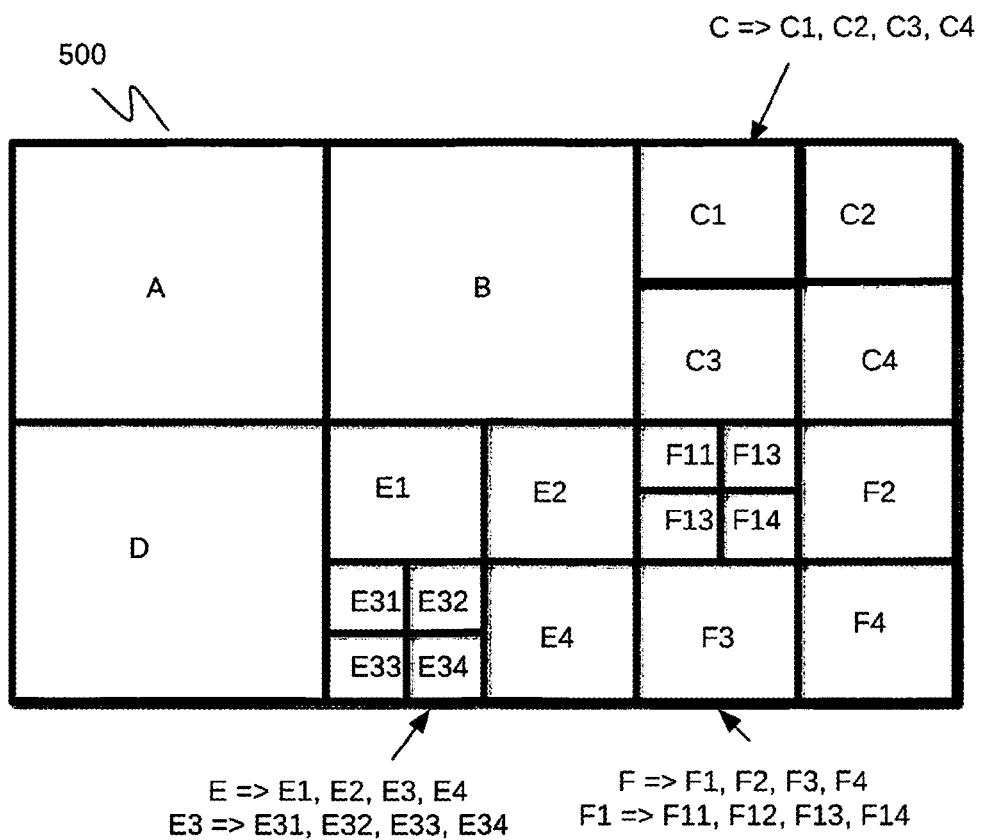
FIG. 5 is example of partitioning of image to be decoded using methods of embodiments.

Decoding Splitbit information results on "grid" of blocks over the image area 500 as shown in FIG. 5.

As third step Methodbits are used in decoding process. Information content is 0 0 1 0 0 0 0 0 0 0 0 0 0 0 0 0 0 0 0 0 0 0 0. The third bit of the Methodbits is "1" indicating that the third block in the grid should be applied with gradient function. The third block is block C1 of FIG. 5. All others should be applied with constant colour as defined in decoding rules of the embodiment.

In fourth step Value information is used in decoding process. Information content is 10 10 20 25 15 20 10 10 10 10 10 10 5 10 5 5 5 5 5 5 10 5 5 5.

The first value 10 indicates colour of first block A (blue). Said colour is applied to the block A.

The second value 10 indicates colour of second block B (blue). Said colour is applied to the block B.

For the third block method is "gradient" the values 20, 25, 15 and 20 indicate color of each corner of block C1 i.e. Red with 20 to top left corner, 25 to top right corner, 15 to bottom left corner and 20 to bottom right corner. Gradient fill to entire block is applied using said starting values for each corner of the block C1.

Figure 6:
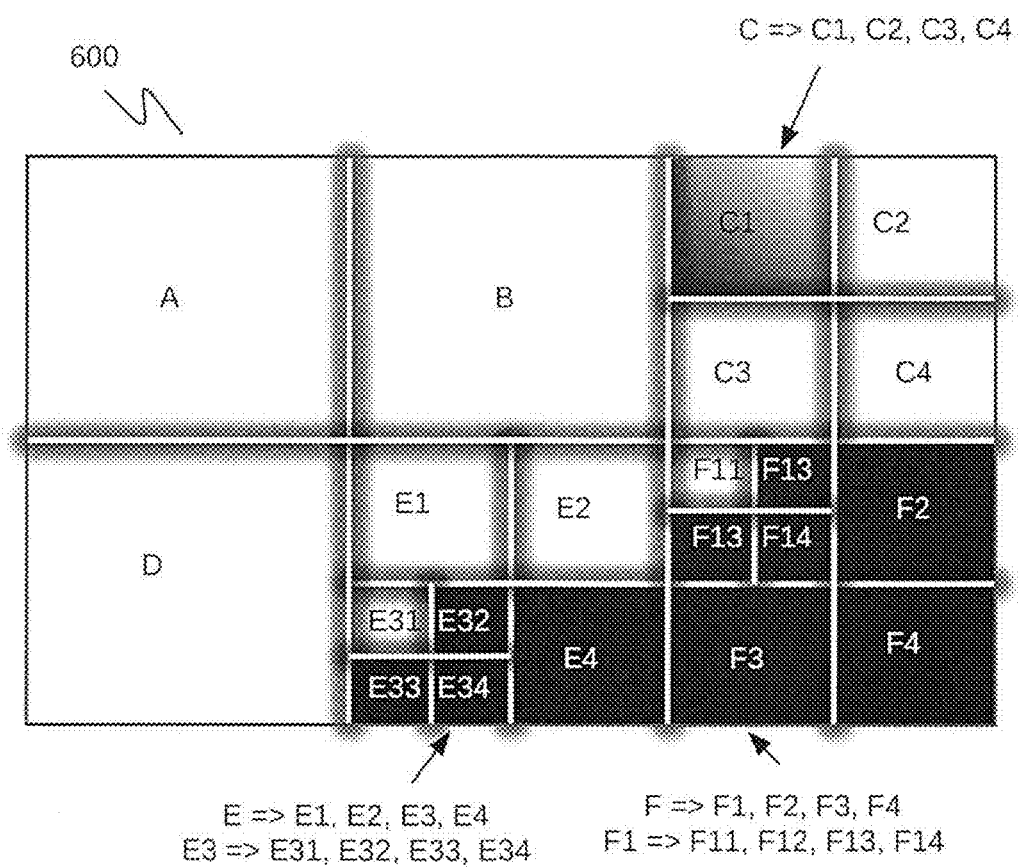
FIG. 6 is example decoded image.

For the fourth block (C2) colour value of 10 is applied etc. Each block is filled with respective colour. Resulting image 600 is shown in FIG. 6. Grid of blocks is shown in the figure for clarity purposes. In actual figure to be displayed for user the grid is not shown.

Algorithm can also include database for storing "common" combinations of block structures and colours. According to embodiment since block group E31, E32, E33 and E34 and block group F11, F12, F13 and F14 have same colour values combination and order (10, 5, 5, 5) it can be considered as one element and designed with own value (referred as Combination Value). Said combination value can be stored in a database (of encoder or decoder) and called with Reference Identification number when needed.

In the example above, the values have been described based on luminance, and different colors in the example have also produced different luminance values. However, this is not always the case, and therefore it is often beneficial to use a different split bit distribution for the chrominance channels. The decoder can be implemented in such a way that it can receive split bits, method bits and data value bits separately for each channel. The decoder can also be implemented in such a way that for example the split bits (i.e. segmentation information) are common for all the channels, but the method bits and their parameters and values are separate for each chrominance channel. The corresponding aspects are used also for other types of data, such as the right and left channel of a stereo audio signal, or for the distance and intensity information of 3D data.

The example described above remains the same as long as the initial block size is smaller than 10×10 (e.g. 5×5). In the following, another example is described using a minimum block size 10×10, which does not affect any splitting decision but reduces the amount of SplitBits to be inserted into the encoded data. This is because the blocks of size 10×10 cannot anymore be splitted and thus no SplitBits need to be delivered.

Another Example
Imagesize: 120×80 pixels
InitialBlocksize: 40×40 pixels
MinimumBlocksize: 10×10 pixels
SplitBit: 0 0 1 0000 0 1 0010 1 1000
MethodBits: 0 0 1 0 0 0 0 0 0 0 0 0 0 0 0 0 0 0
Values: 10 10 20 25 15 20 10 10 10 10 10 10 5 10 5 5 5 5 5 5 10 5 5 5

Where, as an additional definition to the definitions introduced in the previous example: MinimumBlocksize defines the minimum size of the blocks, after which the blocks having reached the defined minimum size cannot be anymore split.

In first step of decoding an image an image area of 120×80 pixels is reserved from memory of the device where decoding takes place. The image area 402 is split to six 40×40 init blocks as shown in FIG. 4. Said blocks are marked with letters A, B, C, D, E and F for clarity purposes.

In second step of decoding the image Splitbit information content (0 0 1 0000 0 1 0010 1 1000) is used to split image area 402 to further blocks.

The bit number 1 of Splitbit information content is "0" indicating that the block A will not be split further.

The bit number 2 of Splitbit information content is "0" indicating that the block B will not be split further.

The bit number 3 of Splitbit information content is "1" indicating that the block C will be split to sub blocks.

The bit number 4 of Splitbit information content is "0" indicating that sub block 1 (later C1) of the block C will not be split further.

The bit number 5 of Splitbit information content is "0" indicating that sub block 2 (later C2) of the block C will not be split further.

The bit number 6 of Splitbit information content is "0" indicating that sub block 3 (later C3) of the block C will not be split further.

The bit number 7 of Splitbit information content is "0" indicating that sub block 4 (later C4) of the block C will not be split further.

The bit number 8 of Splitbit information content is "0" indicating that the block D will not be split further.

The bit number 9 of Splitbit information content is "1" indicating that the block E will be split to sub blocks.

The bit number 10 of Splitbit information content is "0" indicating that sub block 1 (later E1) of the block E will not be split further.

The bit number 11 of Splitbit information content is "0" indicating that sub block 2 (later E2) of the block E will not be split further.

The bit number 12 of Splitbit information content is "1" indicating that the sub block E3 will be split to sub blocks. Because the block is already of the same size as the minimum block size, namely 10×10, it is not to be split any further.

The bit number 13 of Splitbit information content is "0" indicating that sub block 4 (later E4) of the block E will not be split further.

The bit number 14 of Splitbit information content is "1" indicating that the block F will be split to sub blocks.

The bit number 15 of Splitbit information content is "1" indicating that the sub block F1 will be split to sub blocks Because the block is already of the same size as the minimum block size, namely 10×10, it is not to be split any further.

The bit number 16 of Splitbit information content is "0" indicating that sub block F2 will not be split further.

The bit number 17 of Splitbit information content is "0" indicating that sub block F3 will not be split further.

and

The bit number 18 of Splitbit information content is "0" indicating that sub block F4 will not be split further.

Figure 9:
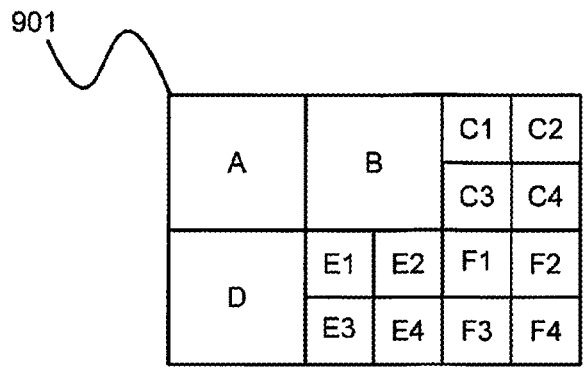
Figure 9:
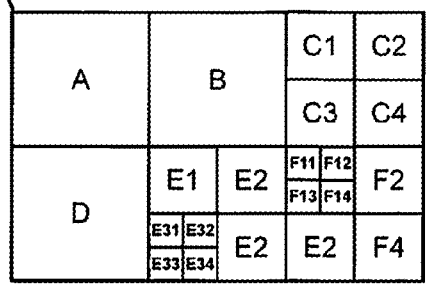

Decoding Splitbit information results on "grid" of blocks over the image area 902 as shown at the bottom of FIG. 9. It is similar to the image displayed in FIG. 5, because the selected MinimumBlocksize is small enough so as to enable the execution of necessary splits.

As third step Methodbits are used in decoding process. Information content is:

0 0 1 0 0 0 0 0 0 0 0 0 0 0 0 0 0 0.

The third bit of the Methodbits is "1" indicating that the third block in the grid should be applied with gradient function. The third block is block C1 of FIG. 5. All others should be applied with constant colour as defined in decoding rules of the embodiment.

In fourth step Value information is used in decoding process. Information content is 10 10 20 25 15 20 10 10 10 10 10 10 5 10 5 5 5 5 5 5 10 5 5 5.

The first value 10 indicates colour of first block A (blue). Said colour is applied to the block A.

The second value 10 indicates colour of second block B (blue). Said colour is applied to the block B.

For the third block the method is "gradient", or slide coding method, the values 20, 25, 15 and 20 indicating colour of each corner of block C1 i.e. red with 20 to top left corner, 25 to top right corner, 15 to bottom left corner and 20 to bottom right corner. Gradient fill, or slide coding method, to entire block is applied using said starting values for each corner of the block C1.

For the fourth block (C2) colour value of 10 is applied and so forth. Each block is filled with respective colour or other decoded data content.

Figures 8A, 8B:
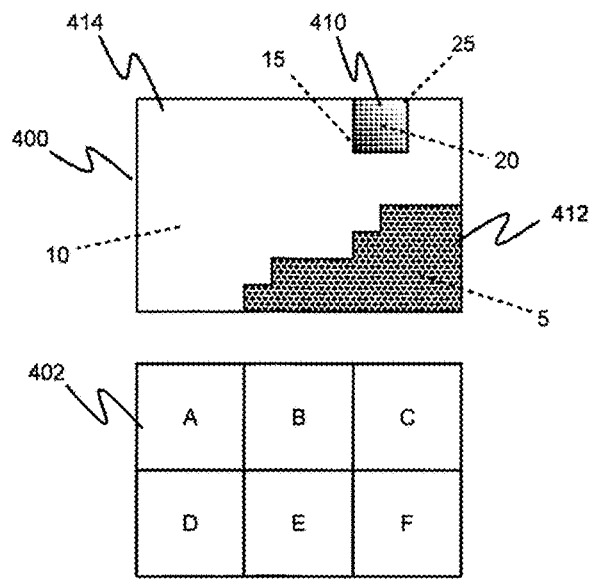
FIG. 8A is an example image and example initial image split to be used according to embodiments of the present disclosure.
FIGS. 8B and 8C are example images and examples presenting alternatives of split and combine bits and also how the block(s) in question are split/combined at the decoder after it has read a bit. The order of execution will correspond to the order in which the encoder made its decisions.
Figure 8C:
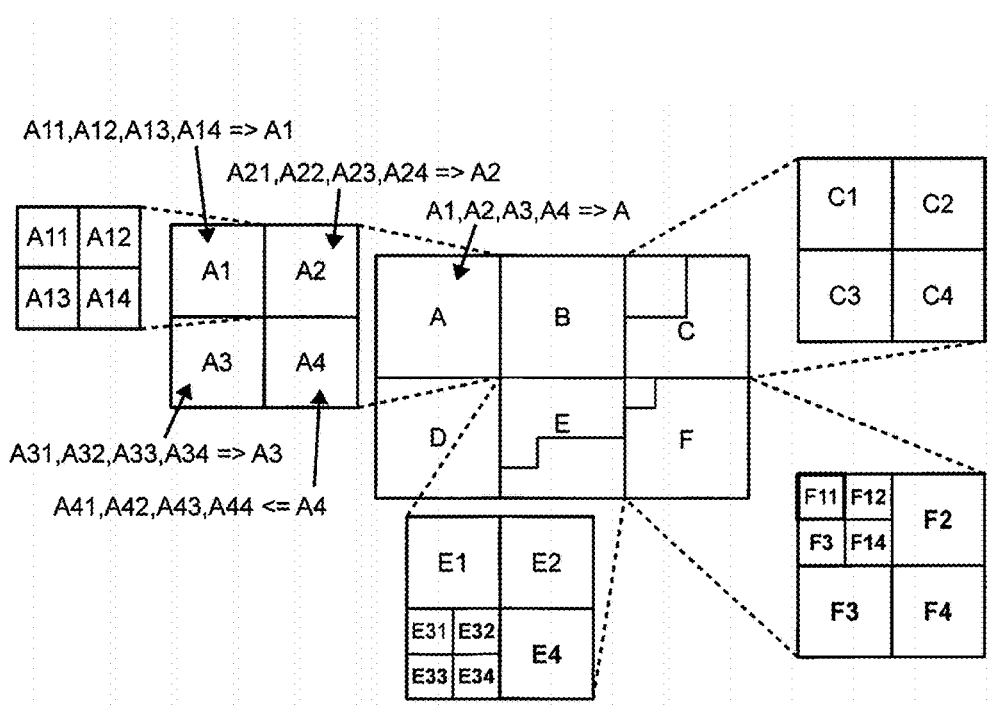
Figure 8D:
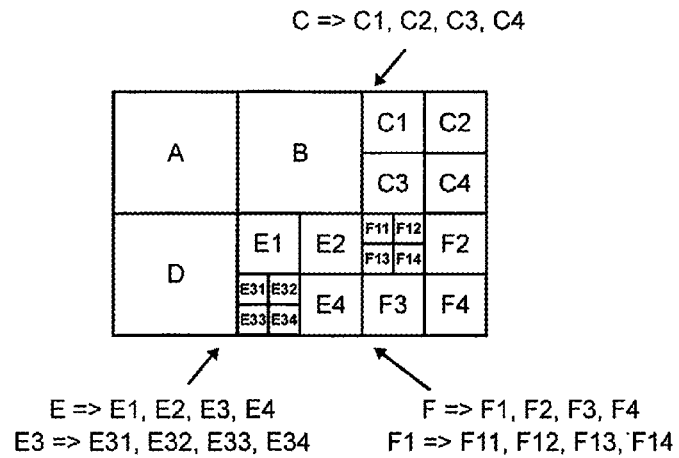
FIG. 8D is an example of how the blocks were split/combined based on the example split/combine bit strings depicted in the tables of image of FIG. 8C.
Figure 8E:
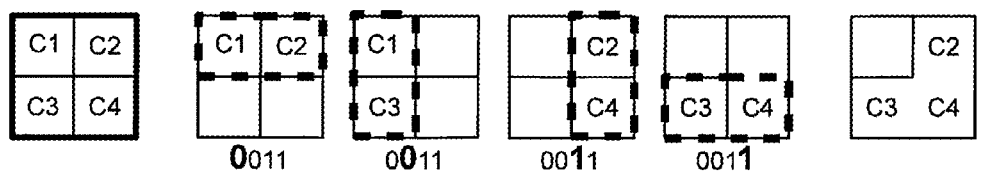
FIGS. 8E, 8F, 8G, 8H, 8I and 8J are example images and examples on how segmentations of blocks inside and between init blocks can be executed based on the split/combine bit strings delivered to the decoder by the encoder.
Figure 8F:
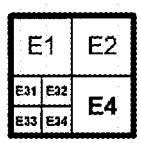
Figure 8F:
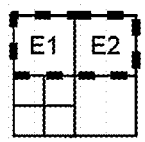
Figure 8F:
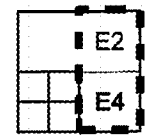
Figure 8F:
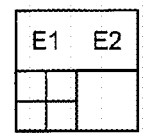
Figure 8F:
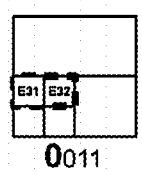
Figure 8F:
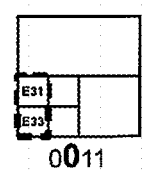
Figure 8F:
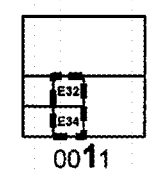
Figure 8F:
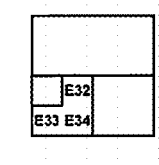
Figure 8G:
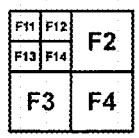
Figure 8G:
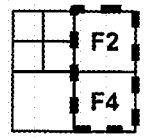
Figure 8G:
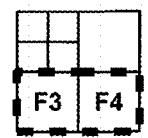
Figure 8G:
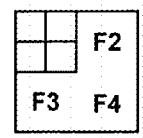
Figure 8G:
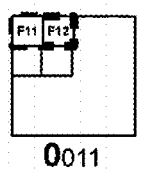
Figure 8G:
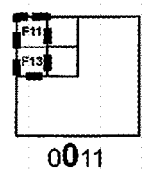
Figure 8G:
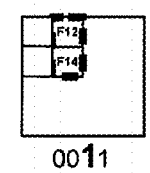
Figure 8G:
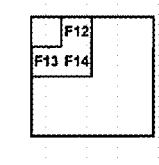
Figures 8H, 8I:
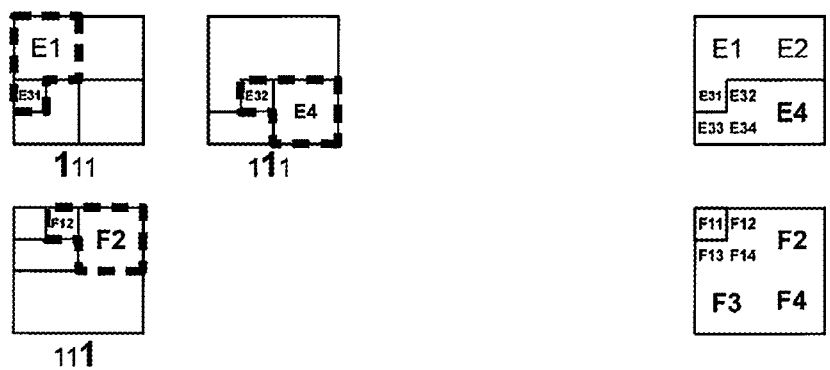
Figure 8J:
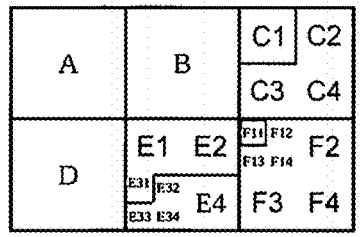
Figure 8J:
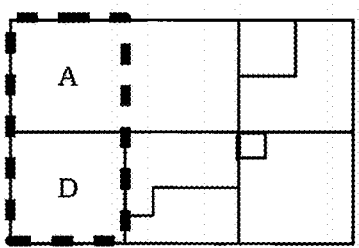
Figure 8J:
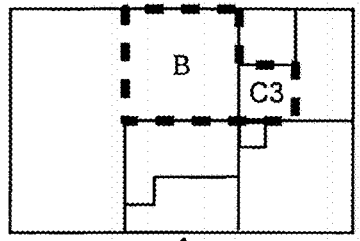
Figure 8J:
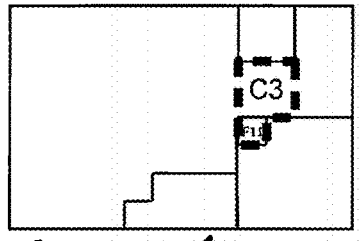
Figure 8J:
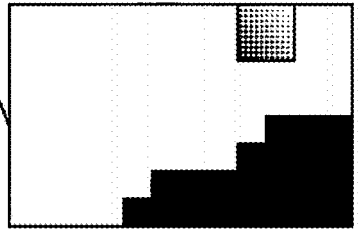
Figure 8J:
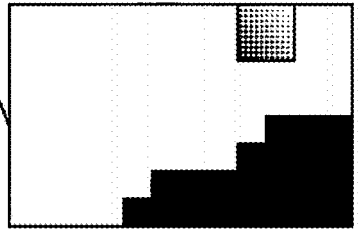

Resulting images 600, 800, 1002 are shown respectively in FIG. 6, at the bottom of FIG. 8J and at the bottom of FIG. 10.

it should be noted that the grid of blocks in the FIGS. 6 and 10 is shown in the figures for clarity purposes. In actual figures to be displayed for user the grid is not shown.

Algorithm can also include database for storing "common" combinations of block structures and colours. According to embodiment since block group E31, E32, E33 and E34 and block group F11, F12, F13 and F14 have same colour values combination and order (10, 5, 5, 5) it can be considered as one element and designed with own value (referred as Combination Value). Said combination value can be stored in a database (of encoder or decoder) and called with Reference Identification number when needed.

In the following example, the minimum block size 20×20 is used, which has an effect both on the segmentation and also on the decisions on the selected coding methods:

Imagesize: 120×80 pixels
InitialBlocksize: 40×40 pixels
MinimumBlocksize: 20×20 pixels
SplitBit: 0 0 1 0 1 1
MethodValues: 0 0 1 0 0 0 0 0 0 2 0 2 0 0 0
Values: 10 10 20 25 15 20 10 10 10 10 10 10 (xx1) 5 (xx2) 5 5 5
DCT Values: DCT transformation content related to blocks E3 and F1

As regards the DCT transform coefficients, they are not presented in this example. However, locations are marked in the Value stream as the character strings xx1 and xx2, placed inside brackets. At those marked locations of the Value stream, the DCT coefficients are needed in the decoding process. However, the encoder has constructed separate sequences of data out of the contents of blocks E3 and F1, produced by executing the DCT transform on the original contents of blocks E3 and F1. The data produced by the DCT transform can then be utilized in decoding the contents of blocks E3 and F1 at the decoder. It should be noted that this example highlights the property that the sequences of data produced by the DCT transform can be delivered in a separate data stream than the sequences of data produced by the DC and slide methods.

Where, as an additional definition to the definitions introduced in the previous examples:

MethodValues describe what to do with each block. As an example, "0" can refer to filling a block with uniform colour (e.g. DC method), "1" might refer to applying colour gradient to a block (e.g. slide coding method), "2" might refer to applying DCT-transformation.

It should be noted that because the count of different methods now exceeds two, the method selection bits cannot be used any longer. Instead, method selection values need to be used, which can possibly be encoded using e.g. either VLC or range coding.

In a first step of decoding an image, area of 120×80 pixels is reserved from memory of the device where the decoding takes place. The image area 402 is split to six 40×40 init blocks as shown in FIG. 4. Said blocks are marked with letters A, B, C, D, E and F for clarity purposes.

In a second step of decoding the image, Splitbit information content (0 0 1 0 1 1) is used to split image area 402 to further blocks.

The bit number 1 of Splitbit information content is "0", indicating that the block A will not be split further.

The bit number 2 of Splitbit information content is "0", indicating that the block B will not be split further.

The bit number 3 of Splitbit information content is "1", indicating that the block C will be split to sub blocks. Because the block is already of the same size as the minimum size (20×20), is not to be split any further.

The bit number 4 of Splitbit information content is "0", indicating that the block D will not be split further.

The bit number 5 of Splitbit information content is "1", indicating that the block E will be split to sub blocks. Because the block is already of the same size as the minimum size (20×20), it is not to be split any further. It should be noted that block E3 cannot be coded with the DC or slide methods so that the result would be only slightly distorted, so a new method, namely DCT is required.

The bit number 6 of Splitbit information content is "1", indicating that the block F will be split to sub blocks. Because the block is already of the same size as the minimum size (20×20), it is not to be split any further. It should be noted that block F1 cannot be coded with the DC or slide methods so that the result would be only slightly distorted, so a new method, namely DCT, is required.

Decoding Splitbit information results on "grid" of blocks over the image area 901 as shown at the top of FIG. 9. It is different from FIG. 5, because the MinimumBlocksize is so large that two otherwise needed splits cannot be executed. Referring to the later FIGS. 9 and 10 and their description, FIGS. 9 and 10 illustrate the effects of minimum block size on the segmentation of an image, and on the selected coding methods.

As a third step, MethodValues are used in decoding process. Information content is 0 0 1 0 0 0 0 0 0 2 0 2 0 0 0. The third value of the MethodValues is "1" indicating that the third block (C1) in the grid should be applied with gradient function. The third block is block C1 depicted at the top FIG. 9. Similarly, MethodValues "2" for the blocks nr. 10 E3 and nr. 12 F1 indicate that the blocks E3 and F1 are to be decoded using the inverse DCT transform. All others should be applied with constant colour as defined in decoding rules of the embodiment.

In a fourth step, Value information is used in decoding process. Information content is 10 10 20 25 15 20 10 10 10 10 10 10 (xx1) 5 (xx2) 5 5 5, plus the DCT coefficients in their own data stream. The DCT coefficients are used when value content data for blocks E3 and F1, marked as xx1 and xx2 positions in the value stream, are decoded.

The first value 10 indicates colour of first block A (blue). Said colour is applied to the block A.

The second value 10 indicates colour of second block B (blue). Said colour is applied to the block B.

For the third block method is "gradient" the values 20, 25, 15 and 20 indicate colour of each corner of block C1 i.e. red with 20 to top left corner, 25 to top right corner, 15 to bottom left corner and 20 to bottom right corner. Gradient fill to entire block is applied using said starting values for each corner of the block C1.

For the fourth block (C2) colour value of 10 is applied. The blocks E3 and F1 are to be decoded using the inverse DCT transform. Each block is filled with respective colour or with decoded data content. Resulting images 600, 800 and 1001 are shown respectively in FIG. 6, at the bottom of FIG. 8J and at the top image of FIG. 10. It should be noted that the grid of blocks in FIGS. 6 and 10 is shown in the figures for clarity purposes only. In the actual image to be displayed for the user the grid is not shown.

At this point of execution, it is possible to insert the decoded block data produced by inverse DCT transform into a database, so that it would be efficient to code data blocks with similar content by utilizing a (dynamic) database, e.g. using method 3, without using e.g. the method 2. It does not make sense to insert blocks decoded by the DC method into a database. However, it is sometimes beneficial to insert blocks decoded by the slide method into a database, but often even they can be coded more efficiently using the slide method than with the database method. Moreover, the database works more efficiently when blocks decoded by the slide or DC method are not inserted into the database.

It is to be noted that it is the encoder which makes the split/combine decisions and the decisions concerning the used encoding methods. The decoder merely carries out the instructions given by the encoder.

In this specific case, it should be noted that the content and size of blocks E3 and F1 are the same. If the decoded block data of E3 had been inserted into a database, then block F1 could be decoded by retrieving the decoded block data of E3 from a database, e.g. by using method number 3 (Dynamic database). This would reduce the amount of DCT data that otherwise would need to be signaled twice. If the database method were used for block F1, then the DCT data would be signaled only once, the method selection number of block F1 would change from 2 to 3, and the database reference would be signaled in its own stream. In this example case, the reference could be zero, because only one decoded block (E3) had at that point been inserted into the database and because it was decided in this example not to insert the DC and slide blocks into a database.

It should be appreciated that the above presented examples are not construed to restrict the embodiments of the disclosure to contain only splitting of the data content items, but data content items can also be combined, as will be elucidated in the Figures later in the application. Similarly, as with SplitBits regarding the blocks of minimum size, in combining blocks the CombineBits for the blocks having reached the maximum size of the blocks, do not need to be inserted into the encoded data as the decoder already knows, based on the block size, that the block in question will not be combined further.

Device Example

Figure 7:
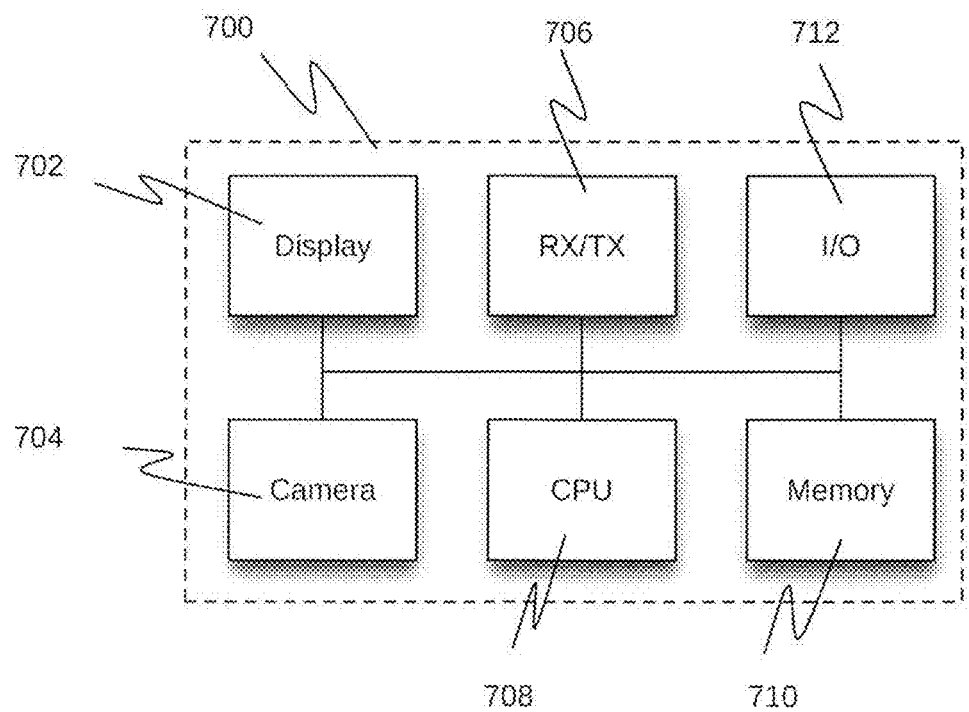
FIG. 7 is an example device in which decoding method can be executed.

In one embodiment the decoding can be implemented in a portable device 700 as shown in FIG. 7, such as a smart phone or a digital camera or a video camera. The portable device 700 optionally includes a camera (KAM) 704 for capturing one or more images, a display (DISP) for showing the one or more images, a receiver/transmitter (RX/TX) 706 to enable communication using cellular wireless networks or local area networks, and other Input/Output (I/O) devices 712 such as a Universal Serial Bus (USB) or Ethernet. The portable device 700 optionally also includes a Central Processing Unit (CPU) 708 for executing decoding (and encoding) related algorithms and instructions, a memory (MEM) 710 for storing the one or more images from the camera, and software for the decoding of encoded image content. The portable device 700 can be configured to store one or more encoded images in its local memory 710, and/or or it can be configured to ask periodically, upon request, upon user action, in real-time or substantially real time, encoded images via the receiver/transmitter (RX/TX) 706 or via the Input/Output (I/O) 712 from external systems.

A simplified example of an embodiment of how an original example image was like is shown in FIG. 8A. An original image 400 to be encoded had a flat blue area 414, shown as white in the FIG. 8A for clarity, a green area 412, shown dotted in FIG. 8A for clarity, and a sliding red area 410, shown in stippling in FIG. 8A for clarity. The size of image 400 can be arbitrary, for example 12×8 elements or pixels, or 24×16 elements or pixels, or 120×80 elements or pixels, and so forth. Initial block sizes 402 for the image 400 were selected in encoding as 4×4 elements or pixels, or 8×8 elements or pixels, or 40×40 elements or pixels respectively for different image sizes. In the embodiment, there are six initial element blocks or pixel blocks A, B, C, D, E and F as illustrated. FIG. 8B illustrates a case where the minimum block size was selected to be 4 times smaller (e.g. 10×10 in this example) than the initial block size (e.g. 40×40 in this example) and the initial split is executed in the combine direction for all init blocks.

FIG. 8C presents a combined image where the decoder has operated according to the split string, or combine string, or split/combine string that it received from the encoder, together with the information about the maximum and minimum block sizes. In the case where a combine string was used, the small blocks A11, A12, A13 and A14 have first been combined into a larger block A1, and correspondingly the small blocks A21, A22, A23 and A24 combined into a larger block A2 , the small blocks A31, A32, A33 and A34 combined into a larger block A3, and the small blocks A41, A42, A43 and A44 combined into a larger block A4 . After this the new blocks A1, A2, A3 and A4 have been further combined into a larger block A. A similar combining procedure has been executed for the B11 . . . B44 blocks and for the D11 . . . D44 blocks.

The tables in the lower part of FIG. 8C show the distribution of combine bits, split bits, and split/combine bits, namely the three alternative ways of expressing and delivering the result of the segmentation to the decoder. It should be noted that only one table of values is delivered to the decoder, depending on the embodiment. The table on the left in FIG. 8C represents the combine bits, while the middle one presents the split bits and the table on the right represents both the split and combine bits. It can be seen in the tables that in the split table, '1' is equal to "was split", while '0' is equal to "was not split". Correspondingly, in the combine table, "was combine>>" is equal to '1' and "was not combined" is equal to '0'.

First, the processing of combine bits in the table on the left is explained. For blocks A, B and D, the first four values '1' in the table on the left indicate that the original small blocks A11 . . . A44 could all be combined into blocks A1 . . . A4, and the single value '1' therein indicates then that the blocks A1, A2, A3 and A4 can be further combined into a larger block A. For blocks B and D, the process is the same. The split bits of the larger blocks A, B and D in the middle table consequently have the value 0, indicating that they do not need to be split. Correspondingly, the split/combine values for these blocks in the table on the right are 00, where the first zero indicates that the split direction was selected, and the second zero indicates that the block is not to be split.

However, as regards the C blocks, the first four combine values there too are '1111', indicating that that the smallest blocks are to be combined, but the subsequent rightmost single combine value '0' indicates that the blocks C1 . . . C4 will no longer be combined into one block C.

As regards the split bits of block C, they are consequently '1 0000' as shown in the middle table of FIG. 8C. The split/combine bits in the table on the right are '0 1 0000'. These values occur because the split direction was selected, which accounts for the '0', and C is divided into four segments (C1, C2, C3 and C4), which produces the '1', and none of the new blocks will be split further, which is indicated by '0000'. That is, the first zero in the table on the right that presents split/combine bits indicates that the split direction was selected, and thereafter the following values correspond to the values in the middle table that presents the split bits.

As regards the E blocks, the four combine values there are '1101'. That is, blocks E11 . . . E24 are combined to blocks E1 and E2, blocks E1 . . . E34 are not combined and blocks E41 . . . E44 are combined to a block E4 . Correspondingly, the values for the block E are '1 0010' in the table that presents the split bits. The values in the table that presents split/combine bits are '1 0010' because, firstly, the combine direction was selected for block E, thus '1', followed by the combine bits in flipped order to that of the combine bits in the table on the left. The flipped bit representation was selected in this case because the flipped order helps minimize the total amount of bits with value '1'.

This representation of split/combine bits for block E also serves as an exemplary embodiment describing how selections, decisions and the bit strings used to represent them can be freely defined, as long as the encoder and the decoder are able to operate according to the same definitions.

As regards the F blocks, the four combine values therein are '0111', indicating that the blocks F21 . . . F44 were combined to blocks F2, F3 and F4. '0' in the beginning indicates that F11 cannot be combined with F12, F13 and F14 . The values for the block F in the table that indicate split bits are '1 1000'. The values in the table that indicate split/combine bits are also '1 1000', because the combine direction was selected, thus the first bit is '1', which is then followed by the corresponding combine bits from the table on the left, in flipped order. As stated above, the three tables in the lower part of FIG. 8C represent three alternative ways of expressing and delivering the result of the segmentation to the decoder, only one of which is actually delivered.

The blocks A . . . F depicted in the examples are the fundamental blocks, namely initial blocks, or «init blocks», of the method pursuant to the disclosure. They are of maximum size whereas the blocks A1 . . . to F44 are of minimum size. Those fundamental (init) blocks are handled as independent sections during the processing. The size of these blocks determines how much memory bandwidth and other processing requirements are needed. Each of those init blocks is usually processed from beginning to end before proceeding to the next init block, one at a time. It should be appreciated that the init blocks can also be processed in parallel, but even in such a case, in the process pursuant to the disclosure, their data is assembled in such a way that after the parallel processing, the data belonging to one individual init block are usually placed together in a sequence, followed by the data belonging to another init block, and so forth.

In cases when the segmentation of data is executed into the split direction, then these init blocks A . . . F are also blocks produced by the initial segmentation performed in the beginning of the processing. The splitting of blocks that may be executed later use these blocks as their starting point. These blocks are then split according to the split bits. It is for this reason that these blocks are called 'init blocks' in this application, even though the initial segmentation in the beginning of the processing in case of combine direction typically produces far smaller blocks than these init blocks.

Now, when the initial segmentation is executed in the split direction, then maximum blocks (i.e. typically the same size as init blocks) are usually used as the starting point. That is, the splits of split direction are commenced, and they may continue until minimum block size is reached. Correspondingly, when blocks are processed in the combine direction, the initial segmentation typically starts with minimum sized blocks that may then be combined up until the maximum block size. However, regardless of which direction is used, the process is usually executed one init block at a time. It should be noted that it is also possible to combine init blocks with each other as in FIG. 8H, but in such a case, memory consumption and algorithm complexity would increase considerably. Combining init blocks with each other would cause a large part of the possible advantages with regard to parallelization of processes to be lost. If init blocks are not combined with each other, then init blocks can be processed in parallel, and often even entirely independent on one another.

In other words, the final result of the segmentation produced by each table is the same. However, the leftmost table uses only combinations, the middle table uses only splits, whereas the rightmost table uses either splits or combinations, according to the direction bit. Often, the combination decisions are made between two blocks (examples of this are presented in later Figures). However, in this specific example, it was intended to express that a combination decision can be made also between four blocks, in which case four blocks are combined into one block. The corresponding split decision in the example is thus made so that one block is split into four blocks. Even split decisions can be correspondingly made so that one block is divided only for example into two blocks. In that case, conditions will have to be determined. For example, a split is executed into the direction in relation to which the block in question is larger, e.g. a 4×8 or 8×4 block is split into two 4×4 blocks. Or, if both directions are as large, then the split may be set to occur first horizontally (or vertically). For example, an 8×8 block is split into two 8×4 blocks (two 4×8 blocks).

An example of implementing code for the aforementioned encoding process is to give a value "0" for a block which is not split, and a value "1" for a block which needs to be split. Using such logic, the above example was coded by the encoder as the following Split Bits:

0 0 1 0000 0 1 0010 0000 1 1000 0000, wherein a first two logic values "0" illustrate that the two initial blocks A, B are not to be split, the third block C is to be split and defined by a logic value "1" as aforementioned, but the sub-blocks are not to be split, the fourth block D is not to be split, the fifth block E is to be split, the first two sub-blocks E1, E2 are not to be split, but sub-block E3 is to be split, and so forth. The Bit String can have been, for example, run length coded so the decoder would have to decode it first. The additional '0000' sections are needed for blocks E and F if the minimum block size is smaller than the size of blocks E31-E34 and F11-F14 in FIG. 8C. FIG. 8D is the end result of the segmentations conducted to the image in FIG. 8A.

Now follows a detailed explanation of such a case where the decoder receives a Split Bit string. The decoder proceeds to reconstruct the image presented in FIG. 8A according to the Split Bit string 0 0 1 0000 0 1 0010 0000 1 1000 0000, as follows: The first zero indicates that the large init-block-sized block A does not need to be split, so the decoder writes the same color value into the entire reconstructed block. The same applies to the large block B, indicated by the next zero. The third bit is '1', indicating a split of the init-block-sized block C into C1, C2, C3 and C4, whereas the next four bits are '0', indicating that blocks C1, C2, C3 and C4 shall not be split further.

The next bit in the string is '0', indicating that the init-block-sized block D does not need to be split, so the decoder writes the same color value into the entire reconstructed block. The next bit in the string is '1', indicating that init-block-sized block E needs to be split into blocks E1, E2, E3 and E4, of which block E3 shall be split, indicated by the '1' in the following '0010' sequence. The next bit in the string is '1', indicating that init-block-sized block F needs to be split into blocks F1, F2, F3 and F4, of which block F1 shall be split, indicated by the '1' in the following '1000' sequence.

It should be appreciated that in some embodiments, where the block is already of a minimum size, there is optionally no need to deliver a split bit "0" to indicate that the block in question shall not be split, as the decoder knows already based on the delivered size information that the block in question cannot be split further. The same applies to the combination of blocks when a block is already of the defined maximum size. The defined minimum and maximum block sizes are delivered by the encoder to the decoder, or they are known beforehand. That is, the expression <<information indicative of splitting/combining>> in the claims means that information can be except split/combine bits, or some other way of communicating the needed splitting/combining, also information of the minimum or maximum size reached by the block or packet in question. Similarly, the expression also covers delivering information of split/combine direction(s).

As already elucidated in an earlier example, the split bit string in the example of splitting blocks in such a case where the minimum block size is 10×10 would be as follows:

0 0 1 0000 0 1 0010 1 1000

FIG. 8C illustrates how and why the split bit string above was constructed. Reference is made to the below explanation of FIG. 8C. It should be noted that this is the same bit string that is depicted in the middle table of FIG. 8C. The <<extra>> bits indicating <<no-split>> are not included in this bit string.

This will be the case if it is previously known that the sizes of the blocks E31 . . . E34 and F11 . . . F14 are already equal to the minimal defined block size. This means that they cannot be split further, and thus separate split bits do not need to be received for them to express that the block shall not be split anymore. FIG. 8C presents the split bits of the block so that the bits of each init block A . . . F have been distinctly separated from one another.

Regarding minimum and maximum block sizes, it should be appreciated that the encoder may make its decisions freely at first, and then, when the decisions are complete, the encoder can compute whether it still might be better to determine minimum and maximum block sizes, which help optimize the count of used split and combine bits. Each time a new value (for the minimum and maximum block sizes) is set, then its possible effects must be assessed and taken into account in the encoded data; this applies e.g. to split/combine bits, method selection values, method parameters and data values. This assessment must be done in such a way that all the sequences of data are correct and in the right order, so that the decoder can, utilizing those decisions and values, duly repeat the process on how the encoder decided to encode the data.

Now follows a detailed explanation of a case where the decoder receives a Combine Bit string. A simplified example of an embodiment of a segmentation process where blocks are combined is shown in FIG. 8B and in FIG. 8C. The decoder receives the e.g. a Combine Bit string 1111 1 1111 1 1111 0 1111 1 1101 0111, according to which it proceeds to reconstruct the image presented in FIG. 8A. The decoder first executes the initial split into maximum block size, then reads the minimum blocks size and combine direction information out of the encoded data, then it creates initial split segmentation shown in FIG. 8B and after that segments the blocks according to the combine bit string it has received shown in FIG. 8C.

First, the decoder proceeds to combine the blocks A11 . . . A44 into blocks A1 . . . A4, as indicated by the four first '1' bits, and then proceed to further combine the blocks A1 . . . A4 into block A, indicated by the fifth '1'. The same procedure is then applied to blocks B11 . . . B44 into B1 . . . B4, and further into B, as indicated by the combination bits 6-10 in the string. Next, the decoder would detect four '1' bits, according to which it would combine the small blocks C11 . . . C44 into blocks C1 . . . C4. However, now the decoder would detect a zero bit, indicating that blocks C1 . . . C4 shall not be combined further.

Next, the decoder detects four '1' bits, according to which it proceeds to combine the small blocks D11 . . . D44 into blocks D1 . . . D4. The next bit is also '1', so the decoder combines the blocks D1 . . . D4 into one init-block-sized block D. Next, the decoder detects a sequence '1101', indicating that blocks E11 . . . E24 shall be combined to blocks E1 and E2, blocks E31 . . . E34 are not to be combined and blocks E41 . . . E44 should be combined to a block E4. Then, the decoder detects a sequence '0111', indicating that the blocks F21 . . . F44 were to be combined to blocks F2, F3 and F4. '0' in the beginning indicates that F11 cannot be combined with F12, F13 and F14.

In situations where the combine bits indicate that the current block should no longer be combined into the other init blocks, then the segmentation process for the block is complete; the decoder can then inspect which methods are available for the block and what its parameters are. Based on that information, the block can then be decoded, and the contents of the block filled with the decoding result for that particular block. In some cases, it is good to complete the entire segmentation, namely block division and combination, and not until then proceed to fill those blocks with content one by one. In other, memory-optimized cases, the block contents are filled and outputted as fast as possible (i.e., as soon as the block will no longer change). The order of execution of course also affects how much and what kind of information about the encoded data the decoder needs to maintain in the memory.

Now follows a detailed explanation of a case where the decoder receives a Split/Combine Bit string. If the decoder had received the alternative bit string depicted in the table on the right of FIG. 8C, namely 0 0 0 0 0 1 0000 0 0 1 0010 1 1000, then the decoder would proceed as follows: It would detect that the first direction bit is '0' indicating the split direction. Thus it would read the next bit, a '0', and deduce that the large block A does not need to be split. The next two zeroes would inform the decoder that the large block B also uses split direction, but the block does not need to be split either. The fifth bit in the string is also '0', indicating a split direction. Thus the decoder would read the next bit, a '1', and deduce that the large block C needs to be split into blocks C1, C2, C3 and C4. The next bits are the sequence '0000', indicating that no further splits shall be executed for block C. Next, two '0' bits follow, indicating that the large block D also uses split direction, but the block is not to be split. Then, the decoder encounters a '1' bit, indicating that the combine direction was selected for block E. That '1' bit is then followed by the corresponding combine bits from the combine table on the left of FIG. 8C, but flipped, namely '0010', indicating that E3 block cannot be combined from blocks E31, E32, E33 and E34, but blocks E11 -E14 are combined to block E1 etc. Next, the decoder again reads a '1' bit, indicating the combine direction for block F. The final sequence is '1000', indicating that the block F11-F14 are not to be combined to block F1, other small blocks F21-F44 are combined to blocks F2, F3 and F4.

The combine bits for the block E are 1101 in the leftmost table. It indicates that when the combining process begins after the initial division with the small blocks E11-E44, then the blocks E11-E14 are combined into block E1, and correspondingly the blocks E21-E24 are combined into block E2, and blocks E41-E44 are combined into block E4. However, the blocks E31-E34 are not combined, but instead they remain as original small blocks. The split bits for the same block E, presented in the middle table, are 1 0010, which indicates that the block E is split into blocks E1-E4, of which only block E3 is split into blocks E31-E34, whereas the blocks E1, E2 and E4 will not be split in the second iteration. In the rightmost table, for each block, either split bits or combine bits are used. The leftmost bit in each string indicates whether the other bits denote split bits or combine bits. If the leftmost bit is 0, then the other bits are split bits. If the leftmost bit is 1, then the other bits are combine bits. For block E, the leftmost bit is 1, so the other bits of the string denote combine bits in such a way that 0 indicates combine and 1 indicates no combine. That is, the bits are flipped when compared with the leftmost table, the combine table. As the bits after the first bit are 0010, then this indicates that blocks E31-E34 will not be combined, but the other small blocks E11-E14 are combined into block E1, and correspondingly the blocks E21-E24 are combined into block E2, and blocks E41-E44 are combined into block E4.

FIGS. 8A . . . 8D represent scenarios where init blocks are independent and their internal blocks are of regular size. There are many different methods available for handling these type of blocks. In FIGS. 8E . . . 8I, scenarios are introduced where the init blocks are still independent, but the blocks inside them do not need to be regular. This kind of block division produces irregular blocks for which some methods can no longer be used. However, the segmentation therein will be more detailed and more accurate, which may help decrease the total amount of method bits.

FIGS. 8E, 8F, 8G, 8H, 8I and 8J illustrate the following: if the initial segmentation after the initial split had been conducted for example by splitting, or with any of the three alternative ways explained above, then after the initial phase segmentation, combinations can be executed first inside the init blocks (FIGS. 8E . . . 8I) and then between the init blocks (FIG. 8J). Such a procedure may yield a more accurate segmentation alternative that would also be more efficient with regard to coding. The bit value highlighted in FIGS. 8E . . . 8G and 8I with bold font indicates the decision of the combination ('1'="was combined" and '0'="was not combined") for the highlighted combine decision. In the right-most images in all the figures, the result of the combining process for each init block or for the whole sequence of data is depicted.

In FIG. 8J, the independency of the init blocks has been omitted, and the blocks therein are irregular. These alternative scenarios illustrate the possibility to utilize the method pursuant to the disclosure in such a way that, initially, segmentation is performed with less accuracy, processing in a simpler fashion, so that the amount of split/combine bits is small and the amount of bits used by the method is rather large. In the second and third step, the accuracy of the segmentation can be increased by using combine bits, which thus decreases the amount of bits used by the method. In the following there will be described a few practical examples on applying different segmenting methods, thereby further elucidating the aforementioned aspects.

FIG. 8J represents a scenario where combinations are executed between different init blocks, instead of combining the blocks inside the init blocks (A, B, C, D, E, F) as was the case in the examples depicted in FIGS. 8B . . . 8I. That is, FIG. 8J illustrates attempts to combine blocks for example between A and B (doable due to similar content, which means that it is easy to code blocks A and B together, so the combine bit is '1') or between B and C1 (not doable due to the content not being similar, which means that it is not easy to code blocks B and C1 together, so the combine bit is '0'), etc. The table in the lower right corner of FIG. 8J represents the result of the attempts, wherein '1' indicates a possible/successful combination and '0' indicates an impossible/unsuccessful combination.

It should be appreciated that in the example in FIG. 8J, combine bits have not been used to express such decisions that are already known based on prior decisions. For example, there is no need to express that block E2 was combined with block F11, because the combination of blocks C3 and F11 already combined E2 and F11. Correspondingly, there is no need to express that blocks C3 and F12 were not combined, or that block D was not combined with E33, neither is there a need to express that E2 was not combined with F13, because C3 was already combined with block F11 and it was observed during the block-internal combinations that the blocks F11 and F13 cannot be combined with each other.

It is to be also noted that the order in which the combination of blocks is attempted is usually essential: the procedure starts from the upper left corner, moves first to the right and then down, one block border at a time. However, optionally, the order can be changed, and the splits and combinations conducted in the examples are not meant to restrict the embodiments pursuant to the disclosure. Therefore any attempted combination of blocks, for example from one neighbouring block to another, or to a non-neighbouring block is foreseen. The information indicative of splitting/combining is meant to cover also all kind of information related to the order of executing splittings/combinings that are optionally communicated from the encoder to the decoder.

Regarding the content of the newly segmented blocks, the decoder has two choices: it may read the encoding method selection information for each block individually, after having completed the segmentation of that particular block, and then apply the inverse transformation to the one that the encoder used, and fill the block with the decoded content. In other words, once the decoder knows that the block size of the current block is final, it decodes the contents of that block before continuing with the segmentation. However, the decoder may also select to complete the entire segmentation process first, and then decode all blocks at one go. In either case, the decoder needs to decode the encoding method selection information for each block out of the encoded data. The details of applying the decoding methods selected and delivered by the encoder are explained in more detail below.

A part of the method data may reside in data strings (streams) in such a way that they can always be accessed on demand (random access), whereas another part of the data can be such that it is only read in order, which means that data belonging to this type do not need as much buffering at the decoder. In some situations, the parallelization of the decoder requires that the encoded data must be easily separable (if it is desired to optimize memory usage, at the expense of the encoded data), whereas in other situations, the decoder must be able to buffer and separate the data when necessary (in which case the amount of encoded data will be minimized, but the buffering requirement of the decoder will increase).

The following example describes the use of coding methods in a segmentation scenario as described in connection with FIG. 8C:

A further "fill" method, namely method selection, for each block can be coded, for example with a logic value of "0" for assigning flat color for the block, and a logic value "1" for assigning sliding color, namely slide coding method, for the block, referred to as Method Bits:

0 0 1000 0 0000000 0000000

In the code, first two blocks A, B are a flat color, the next block C1 is sliding and the remainder blocks are a flat color. The Method Bits can further be, for example, run length coded. It should be appreciated that using bits is only one example of indicating method selection. Often, there are more than two methods available for selection, and in such a case, other ways can be implemented to indicate the selection. For example, a piece of method selection information can be used that indicates the number of the selected method. In that case, e.g. the DC method could receive the value 1, SlideBiCubic could receive the value 2, DCT could receive the value 3, the CopyLeft method could receive the value 4, the Database method could receive the value 5, etc. The pieces of method selection information thus produced can then later be entropy-coded, in order to minimize their bit count. The same number can be used for describing the same coding method even for the blocks or packets of different size because information regarding the size of the blocks is communicated otherwise, for example, by minimum/maximum size information, using split/combine bits etc. Optionally, coding methods for different sized blocks can be communicated with different numbers if coding efficiency is achieved. For example, probabilities of using a coding method can be very different in respect of blocks or packets of different sizes and it is typically beneficial to number the methods based on the probability order.

It should be appreciated that for flat areas, such as blocks, in the input data, it is advantageous to select the DC method as the coding method, because it produces only one DC parameter per block to be coded. Correspondingly, for a sliding area in an input data, it is advantageous to select as the coding method the slide method that produces four parameters. It should be noted that in the method pursuant to the disclosure, for the blocks or packets of the same size there can be different coding methods used, such as for example, in the above example for the blocks C1 and C2 of the same size, the slide and DC methods were used.

Color values respectively for the blocks are referred as Values, as follows:

10 10 20 25 15 20 10 10 10 10 10 10 5 10 5 5 5 5 5 5 10 5 5 5 wherein a set "20, 25, 15, 20" describe color values of each corner of the block C1. The string of values can be, for example, Huffman coded to reduce data size. Moreover, since the group of sub-blocks E31, E32, E33 and E34 and the group of sub-blocks F11, F12, F13 and F14 have the same color value combination and order, namely (10, 5, 5, 5), it can be considered as one element and designated its own value, referred to as a Combination Value. The Combination Value can be stored in a database, for example of the encoder or a corresponding decoder, and referred to as a Reference Identification number when needed. Often, it is beneficial to use separate streams for values for different methods, for example, in the foregoing example where DC values and slide values can be set to separate streams. Some methods optionally also generate multiple streams by themselves to enable a smaller entropy for each stream that enables better compression efficiency within entropy coding methods, for example using a multilevel coding method wherein high and low levels used when implementing the method can be set to process separate streams, because often high values are closer to each other, similarly as low values are closer to each other, and then employing range coding that uses delta coded high or low values and thus operates efficiently.

According to some embodiments, Split Bits, correspondingly Combine Bits, Method Bits, as well as other ways to indicate splitting and/or combining and the coding method applied, Values and Combination Values can be stored in encoder hardware, for example for subsequent supply to other hardware for decoding purposes.

The segmentation performed in FIGS. 8E . . . I would be expressed as method selection bits per init block as follows:

0 0 10 0 0000 000

The corresponding color values, i.e. the method parameters, would then be as follows:

10 20 25 15 20 10 10 10 5 10 5 10 5 5

The segmentation performed in FIG. 8I whose effects are depicted in FIG. 8J in the first image 'State before combining' (the one in the upper left corner) would be expressed as method selection bits per init block as follows:

0 0 1 0 0 00 0 0

The corresponding color values, i.e. the method parameters, would then be as follows:

10 20 25 15 20 10 10 10 5 10 5

After the segmentation executed in FIG. 8J, the method selection information would be as follows:

0 1 0

The corresponding color values, i.e. the method parameters, would then be as follows:

10 20 25 15 20 5

The depicted example demonstrates how the amount of method selection bits and the method parameters can be considerably decreased by adding a few combine bits.

It should also be noted that the split/combine bits described above can be sent in different orders. One possible alternative scenario would be such where each stage is processed separately. In this scenario, if the combine direction would have been selected already in the first stage, then all the combine bits would be as follows:

1111 1 1111 1 1111 0 1111 1 1101 0111 0011 10 0011 11 0011 11 1 1101111

However, it often makes sense to deliver the combine bits of the first and the second stage so that the bits are placed sequentially init block by init block. If a third stage is available, then the combine bits of the third stage can be added to end of the bit string. In this scenario, the bits would be as follows for the first two stages:

1111 1 1111 1 1111 0 0011 1111 1 1101 10 0011 11 0111 11 0011 1

A reordering of bits such as this often does not affect the total amount of compressed bits. However, reordering has a significant effect on which order the processing is executed and on how much the processing can be parallelized in any given situation.

However, if the split/combine alternative would be selected at the first stage, and if the second stage would be the combine alternative, then it would be beneficial to separate the selection of the split/combine direction into its own stream, and the other stream would then contain the bits produced by the splits and combinations init block by init block. In such a case, the bits would be as follows:

The selection bits for the split/combine direction would be
0 0 0 0 1 1

Then, the bits are expressed in a way that maximizes the count of ones, in which case the designation for the split direction would be 0 and thus the designation for the no-split direction would be 1. Thus, the split/combine bits for the first two stages would be as follows:

1 1 0 1111 0011 1 1101 10 0011 11 0111 11 0011 1

Encoders often use an RD value as quality criteria when making decisions about which method to select. The RD value is computed by adding the estimated amount of used bits multiplied by alpha to a distortion value. The distortion value used is usually the sum of the squared decoding errors (deviations from the original values) per a sequence of data. It should be noted that the decoder implementation is typically more simple and it usually merely repeats the decisions made by the encoder. However, the decoder must be able to support many alternative methods and operating models that a simple or fast encoder does not necessarily have to support and use, in order to be able to produce optimal encoding results, thereby enabling an excellent decoding result. The effects on such decisions are illustrated in FIGS. 9 and 10.

FIG. 9 illustrates the effect of the minimum segment size to the split/combine string delivered to the decoder, and therefore the effect of the minimum segment size to the segmentation result itself.

FIG. 10 illustrates the effect that the different minimum segment sizes used in FIG. 9 had to the decoding of the content of the blocks. The version where the minimum segment size was 10×10 essentially presents the same segmentation process as in FIG. 8C. The version where the minimum segment size was 20×20 goes as follows: The minimal size of 20×20 is inserted into the encoded data, and split bits will then not be inserted into the stream of split bits for blocks of that size. Therefore, the stream of split bits is:
0 0 1 0 1 1.

This means that blocks that have already been split (3×4 blocks=12 blocks) that have the size 20×20, could no longer be split, which again means that the strings of four zeroes they would require in the stream of split bits do not need to be inserted into the encoded data.

For the non-flat content of blocks C1, E3 and F1 in the version where the minimum block size was 20×20, there would have to be such methods (transformations) available (i.e., supported by the decoder), which would help keep the distortion small without increasing the encoded bit size too much. In the example of FIG. 10, the non-flat contents of E3 and F1 would have been decoded e.g. with inverse DCT, where the inverse slide method would have been better for block C1. The decoder of course needs to read and decode the method selection information out of the encoded data prior to decoding the content.

As regards the blocks with flat content (e.g. all pixels are on color), they would have been encoded by the encoder using e.g. the DC method. The decoder would then decode their content e.g. with inverse DC, after having read and decoded the method selection information out of the encoded data.

Modifications to embodiments of the invention described in the foregoing are possible without departing from the scope of the invention as defined by the accompanying claims. Expressions such as "including", "comprising", "incorporating", "consisting of", "have", "is" used to describe and claim the present invention are intended to be construed in a non-exclusive manner, namely allowing for items, components or elements not explicitly described also to be present. Reference to the singular is also to be construed to relate to the plural. Numerals included within parentheses in the accompanying claims are intended to assist understanding of the claims and should not be construed in any way to limit subject matter claimed by these claims.

We claim:

1. A method of decoding encoded input data to generate corresponding decoded output data, the method comprising:
   (a) receiving the encoded input data containing multiple channels as separate channels;
   (b) processing the encoded input data to extract therefrom header information indicative of encoded data pertaining to individual blocks and/or packets included in the encoded input data, and information including data indicative of transformations employed to the individual blocks and/or packets;
   (c) creating an initial set of individual blocks and/or packets based on received header data, and preparing a data field in a data storage arrangement for receiving decoded individual block and/or packet content;
   (d) separately for each channel, retrieving information describing the employed transformations and then applying an inverse of the transformations for decoding the encoded and compressed original block and/or packet data to generate corresponding decoded block and/or packet content for populating said data field; and
   (e) when the encoded input data has been at least partially decoded, outputting data from the data field as the decoded output data.

2. The method as claimed in claim 1 further comprising processing the encoded input data to extract decisions of an initial size of the individual blocks and/or packets, or one or more parameters describing data content and/or data type of the encoded input data, which is indicative of an initial size of the individual blocks and/or packets.

3. The method as claimed in claim 1 further comprising:
   processing the encoded input data to, for each channel separately, extract information indicative of splitting and/or combining of the individual blocks and/or packets to provide decoded output data, the information containing at least one of: information indicative of executing splitting/combining, information indicative of direction of splitting/combining, information indicative of order of splitting/combining, or information that the individual block has already reached its minimum/maximum size; and
   separately for each channel, splitting or combining individual blocks and/or packets in the data field according to the information indicative of splitting/combining.

4. The method as claimed in claim 1 further comprising processing the encoded input data, separately for each channel, to extract information indicative of a plurality of mutually different transformations or combinations of transformations employed to individual blocks and/or packets.

5. The method as claimed in claim 1, wherein the method further comprises decoding blocks and/or packets to a temporal series of data, wherein sub-division of the encoded input data corresponding to a given information to form a plurality of corresponding blocks is made dependent upon content present in one or more data preceding the given data within the temporal sequence of data.

6. The method as claimed in claim 1, wherein step (d) further comprises retrieving supplementary information from a database arrangement for use when executing an inverse of said transformations, said supplementary information including at least one of: algorithms, indices, rules, tables, or one or more transformation parameters.

7. The method as claimed in claim 6, wherein the method further comprises retrieving information from the encoded input data indicative of the database arrangement for enabling decoding of the encoded input data to access said supplementary information employed.

8. A method as claimed in claim 1, wherein the method includes employing for said inverse of the one or more transformations inverses of one or more of: a data base coding method, a DC-value coding method, slide coding method, a scale coding method, a line coding method, a multilevel coding method, an interpolation coding method, an extrapolation coding method, Discrete Cosine Transform (DCT), pulse code modulation (PCM), Differential Pulse Code Modulation (DPCM), Run-Length Encoding (RLE), Split run-length encoding (SRLE), bzip2-specific RLE, Entropy Modifier, Lempel-Ziv Obehumer (LZO), LZ77, LZMA, LUT coding methods, Variable Length Coding (VLC), Huffman-coding, arithmetic coding, range coding, transform coding, delta coding, O-Delta coding, D-Delta coding method, I-Delta coding method, P-Delta coding method, IntraMV coding method, InterMV coding method, color conversion coding method, quantization, wavelet transform, Hadamard transform, or linear transform.

9. The method as claimed in claim 1, wherein the method further comprises decoding at least one of video, image, audio, graphics, economic data, mask data, multi-dimensional data, measurement data, text data, texture data, ECG, seismic, analog-to digital (ADC) converted data, biomedical signal data, genomic data, ASCII, Unicode, calendar data, mathematical data or binary information present in the encoded input data.

10. A non-transitory machine-readable data storage media having stored thereon a computer program, which when executed by a computer processor, causes the computer processor to execute the method as claimed in claim 1.

11. A decoder operable to decode encoded input data to generate corresponding decoded output data, wherein the decoder comprises data processing hardware which is operable:
   (a) to receive the encoded input data containing multiple channels as separate channels;
   (b) to process the encoded input data to extract therefrom header information indicative of encoded data pertaining to individual blocks and/or packets included in the encoded input data, and information including data indicative of transformations employed to the individual blocks and/or packets;
   (c) to create an initial set of individual blocks and/or packets based on received header data, and prepare a data field in a data storage arrangement for receiving decoded individual block and/or packet content;
   (d) to, separately for each channel, retrieve information describing the employed transformations and then applying an inverse of the transformations for decoding the encoded and compressed original block and/or packet data to generate corresponding decoded block and/or packet content for populating said data field; and
   (e) when the encoded input data has been at least partially decoded, to output data from the data field as the decoded output data.

12. The decoder as claimed in claim 11, wherein the data processing hardware is further operable to process the encoded input data to extract decisions of an initial size of the individual blocks and/or packets, or one or more parameters describing data content and/or data type of the encoded input data, which is indicative of an initial size of the individual blocks and/or packets.

13. The decoder as claimed in claim 11, wherein the data processing hardware is further operable to:
   process the encoded input data to, for each channel separately, extract information indicative of splitting and/or combining of the individual blocks and/or packets to provide decoded output data; and
   separately for each channel, splitting or combining individual blocks and/or packets in the data field according to the information indicative of splitting/combining.

14. The decoder as claimed in claim 11, wherein the data processing hardware is further operable to, for each channel separately, process the encoded input data to extract information indicative of a plurality of mutually different transformations or combinations of transformations employed to individual blocks and/or packets.

15. The decoder as claimed in claim 11, wherein the data processing hardware is further operable to decode blocks and/or packets to a temporal series of data, wherein sub-division of the encoded input data corresponding to a given information to form a plurality of corresponding blocks is made dependent upon content present in one or more data preceding the given data within the temporal sequence of data.

16. The decoder as claimed in claim 11, wherein element (d) further comprises retrieving supplementary information from a database arrangement for use when executing an inverse of said transformations, said supplementary information including at least one of: algorithms, indices, rules, tables, or one or more transformation parameters.

17. The decoder as claimed in claim 16, wherein the data processing hardware is further operable to retrieve information from the encoded input data indicative of the database arrangement for enabling decoding of the encoded input data to access said supplementary information used when earlier encoding the input data.

18. The decoder as claimed in claim 11, wherein the data processing hardware is further operable to employ for said inverse of the one or more transformations inverses of one or more of: a data base coding method, a DC-value coding method, slide coding method, a scale coding method, a line coding method, a multilevel coding method, an interpolation coding method, an extrapolation coding method, Discrete Cosine Transform (DCT), pulse code modulation (PCM), Differential Pulse Code Modulation (DPCM), Run-Length Encoding (RLE), Split run-length encoding (SRLE), bzip2-specific RLE, Entropy Modifier, Lempel-Ziv Obehumer (LZO), LZ77, LZMA, LUT coding methods, Variable Length Coding (VLC), Huffman-coding, arithmetic coding, range coding, transform coding, delta coding, O-Delta coding, D-Delta coding method, I-Delta coding method, P-Delta coding method, IntraMV coding method, InterMV coding method, color conversion coding method, quantization, wavelet transform, Hadamard transform, or linear transform.

19. A decoder as claimed in claim 11, wherein the data processing hardware is further operable to decode at least one of video, image, audio, graphics, economic data, mask data, multi-dimensional data, measurement data, text data, texture data, ECG, seismic, analog-to digital (ADC) converted data, biomedical signal data, genomic data, ASCII, Unicode, calendar data, mathematical data or binary information resent in the encoded input data.

20. An electronic consumer product operable to receive and/or store input data, comprising a decoder according to claim 11 for decoding the input data for generating decoded content for providing to at least one user of the consumer product.

21. The electronic consumer product according to claim 20 wherein the electronic consumer product is at least one of: a mobile telephone, a cellular phone, a tablet computer, a television, a portable media playing device, a camera, a personal computer, an editor, a transcoder, a scanner, a facsimile machine, a photocopy machine, a microphone, an audio card, a record player, or a DVD/CD player.

* * * * *